(12) United States Patent
Ahn et al.

(10) Patent No.: US 11,277,711 B2
(45) Date of Patent: Mar. 15, 2022

(54) ELECTRONIC DEVICE FOR DETERMINING LOCATION INFORMATION OF EXTERNAL DEVICE

(71) Applicants: SAMSUNG ELECTRONICS CO., LTD., Suwon-si (KR); SOLUM CO., LTD., Yongin-si (KR)

(72) Inventors: Jungho Ahn, Suwon-si (KR); Hyunsuk Lee, Yongin-si (KR)

(73) Assignees: SAMSUNG ELECTRONICS CO., LTD., Suwon-si (KR); SOLUM CO., LTD., Yongin-si (KR)

( * ) Notice: Subject to any disclaimer, the term of this patent is extended or adjusted under 35 U.S.C. 154(b) by 77 days.

(21) Appl. No.: 16/906,428

(22) Filed: Jun. 19, 2020

(65) Prior Publication Data
US 2020/0404454 A1 Dec. 24, 2020

(30) Foreign Application Priority Data
Jun. 19, 2019 (KR) .................. 10-2019-0072987

(51) Int. Cl.
*H04W 4/029* (2018.01)
*G01S 11/02* (2010.01)
(Continued)

(52) U.S. Cl.
CPC ............ *H04W 4/029* (2018.02); *G01R 33/07* (2013.01); *G01S 11/02* (2013.01); *H04B 1/7163* (2013.01)

(58) Field of Classification Search
CPC .......... H04W 4/029; G01S 11/02; G01S 5/14; G01S 5/016; G01S 13/765; G01S 5/015; G01R 33/07; G01R 33/072; H04B 1/7163
(Continued)

(56) References Cited

U.S. PATENT DOCUMENTS

| 5,606,331 A | 2/1997 | McCorkle |
| 6,590,545 B2 | 7/2003 | McCorkle |
| (Continued) | | |

FOREIGN PATENT DOCUMENTS

| KR | 10-2010-0059214 | 6/2010 |
| KR | 10-2017-0128672 | 11/2017 |

OTHER PUBLICATIONS

International Search Report and Written Opinion dated Oct. 13, 2020 in corresponding International Application No. PCT/KR2020/007948.

*Primary Examiner* — Danh C Le
(74) *Attorney, Agent, or Firm* — Nixon & Vanderhye, P.C.

(57) ABSTRACT

The disclosure relates to an electronic device, which is secured at a designated location, for determining a location area or a location area change of a movable external electronic device or, and an operating method thereof. An operating method of an electronic device including at least one antenna according to various embodiments of the disclosure may include: detecting that a state of a structure is changed from an open state to a close state, counting a sequence number from a first timing at which the state of the structure is changed to the close state to a second timing after a designated time based on information received from an external device via the at least one antenna using a designated communication scheme, determining location information of the external device based on the sequence number, and performing a designated function, based at least in part on the determined location information.

20 Claims, 24 Drawing Sheets

(51) Int. Cl.
   *G01R 33/07* (2006.01)
   *H04B 1/7163* (2011.01)
(58) Field of Classification Search
   USPC .................................. 455/456.1, 456.4, 418
   See application file for complete search history.

(56) References Cited

U.S. PATENT DOCUMENTS

| | | |
|---|---|---|
| 6,806,777 B2 | 10/2004 | Franca-Neto |
| 6,914,552 B1 | 7/2005 | McEwan |
| 6,914,573 B1 | 7/2005 | McCorkle |
| 6,927,688 B2 | 8/2005 | Tice |
| 6,964,811 B2 | 11/2005 | Kishimoto et al. |
| 7,061,442 B1 | 6/2006 | Tang et al. |
| 7,095,372 B2 | 8/2006 | Soler Castany et al. |
| 7,224,944 B2 | 5/2007 | McEwan |
| 7,256,727 B2 | 8/2007 | Fullerton et al. |
| 7,327,315 B2 | 2/2008 | Starkie et al. |
| 7,463,199 B2 | 12/2008 | Soler Castany et al. |
| 7,466,205 B1 | 12/2008 | Lin et al. |
| 7,482,871 B2 | 1/2009 | Lee et al. |
| 7,523,242 B2 | 4/2009 | Lee et al. |
| 7,554,507 B2 | 6/2009 | Kwon et al. |
| 7,622,718 B2 | 11/2009 | Yoshimi et al. |
| 7,733,276 B2 | 6/2010 | Levy et al. |
| 7,792,513 B2 | 9/2010 | Safarian et al. |
| 7,804,456 B2 | 9/2010 | Yekeh Yazdandoost et al. |
| 7,821,465 B2 | 10/2010 | Rozan |
| 7,855,621 B2 | 12/2010 | Guan |
| 7,868,760 B2 | 1/2011 | Smith et al. |
| 7,868,834 B2 | 1/2011 | Ortigosa et al. |
| 7,884,757 B2 | 2/2011 | Mohamadi et al. |
| 7,889,140 B2 | 2/2011 | Wong et al. |
| 7,920,088 B2 | 4/2011 | Thompson et al. |
| 7,924,226 B2 | 4/2011 | Soler Castany et al. |
| 7,962,042 B2 | 6/2011 | Deas |
| 8,130,496 B2 | 3/2012 | Dong et al. |
| 8,207,904 B2 | 6/2012 | Pan et al. |
| 8,270,452 B2 | 9/2012 | Melick et al. |
| 8,351,891 B2 | 1/2013 | Heydari et al. |
| 8,421,686 B2 | 4/2013 | Soler Castany et al. |
| 8,422,947 B2 | 4/2013 | Konya |
| 8,461,989 B2 | 6/2013 | Romero et al. |
| 8,483,630 B2 | 7/2013 | Cathelin et al. |
| 8,531,337 B2 | 9/2013 | Soler Castany et al. |
| 8,547,286 B2 | 10/2013 | Xu et al. |
| 9,477,857 B2 | 10/2016 | Youngquist et al. |
| 9,568,595 B2 | 2/2017 | Zack et al. |
| 9,680,211 B2 | 6/2017 | Kletsov et al. |
| 9,843,108 B2 | 12/2017 | Le et al. |
| 9,935,362 B2 | 4/2018 | Barak |
| 9,950,434 B2 | 4/2018 | Binder |
| 10,020,565 B2 | 7/2018 | Lee et al. |
| 10,090,584 B2 | 10/2018 | Duan et al. |
| 2004/0192247 A1* | 9/2004 | Rotta .................. H03G 3/3042 |
| | | 455/343.1 |
| 2006/0007786 A1* | 1/2006 | Sakata ................ H04M 1/0245 |
| | | 368/10 |
| 2006/0187217 A1* | 8/2006 | Son .................... H04M 1/72457 |
| | | 345/204 |
| 2010/0195699 A1 | 8/2010 | Liu |
| 2011/0032084 A1* | 2/2011 | Nakamura ........ H04M 1/72463 |
| | | 340/309.9 |
| 2014/0002946 A1* | 1/2014 | Kodama .............. H01H 47/002 |
| | | 361/170 |
| 2014/0327752 A1* | 11/2014 | Tsuda ................. G06K 9/00838 |
| | | 348/77 |
| 2015/0289089 A1 | 10/2015 | Raghupathy et al. |
| 2015/0358778 A1* | 12/2015 | Heo .................... G01C 21/362 |
| | | 455/456.6 |
| 2016/0360382 A1* | 12/2016 | Gross ................. G06F 3/04186 |
| 2018/0099643 A1 | 4/2018 | Golsch et al. |
| 2019/0187768 A1* | 6/2019 | DiSessa ................. G06F 1/28 |
| 2019/0318561 A1* | 10/2019 | Padilla ............... G07C 9/00174 |
| 2021/0134103 A1* | 5/2021 | Yamato ................ G06Q 30/06 |
| 2021/0314134 A1* | 10/2021 | Sakuma ................ H04B 10/07 |

\* cited by examiner

FIG.15B

ELECTRONIC DEVICE FOR DETERMINING LOCATION INFORMATION OF EXTERNAL DEVICE

CROSS-REFERENCE TO RELATED APPLICATION

This application is based on and claims priority under 35 U.S.C. § 119 to Korean Patent Application No. 10-2019-0072987, filed on Jun. 19, 2019, in the Korean Intellectual Property Office, the disclosure of which is incorporated by reference herein in its entirety.

BACKGROUND

Field

The disclosure relates to an electronic device, which is secured at a designated location, for determining a location area of a movable external electronic device or determining a change of the location area, and its operating method. For example, various embodiments of the disclosure relate to an electronic device and its operating method for determining the location area or the location area change of the movable external electronic device using ultra-wideband (UWB) communication.

Description of Related Art

Ultra-wideband (UWB) communication is a communication technology for transmitting a signal using very short pulses (several nanoseconds) with low power over a wider broadband than existing communication. The UWB was used for military purposes such as military radar and remote detection, but is expanding its application since federal communications commission (FCC) has authorized its commercial use in 2002 by limiting its use to indoor wireless communication. The UWB communication may accurately measure a time of arrive (TOA) which is a travel time of a pulse to a target, and an angle of arrival (AOA) of a transmitting device, thus enabling indoor and outdoor precise distance and location recognition with an error tens of cm. In particular, the UWB communication may be used to detect location change information of a movable external device and thus automatically detect entry and exit of a building where a user who owns the external device.

To detect location change information of a movable external device using ultra-wideband (UWB) communication, a communication device capable of communicating with the external device may be secured at (or near) a particular structure. For example, the electronic device capable of communicating with the external device may be installed at (or near) a door which may open or close. In this case, the electronic device may not acquire accurate location change information of the external device, depending on a material of the structure. For example, if the structure (e.g., a door) is of a metal material, the electronic device installed near the structure may relatively accurately obtain the location change information of the external device outside the structure but not may relatively inaccurately obtain the location change information of the external device inside the structure. The structure of the metal material may cause diffuse reflection in at least one antenna of the electronic device, and a radiation pattern of the at least one antenna of the electronic device may be changed by the metal structure (no metal penetration of propagation).

SUMMARY

Embodiments of the disclosure may provide an electronic device and an operating method for accurately obtaining location information of a movable external device even if the electronic device is secured near a structure of a particular material (e.g., metal material) which may affect a radiation pattern of an antenna.

An electronic device according to various example embodiments of the disclosure may include: a sensor module including at least one sensor configured to detect a state change of a structure, a communication interface including at least one antenna and configured to communicate with an external device using a designated communication scheme, at least one processor operatively coupled with the sensor module and the communication interface, and at least one one memory operatively coupled with the at least one processor. The at least one memory may store instructions which, when executed, cause the at least one processor to: based on a change of sensing data of the sensor module, detect that a state of the structure is changed from an open state to a close state, count a sequence number from a first timing at which the state of the structure is changed to the close state to a second timing after a designated time based on information received from the external device using the designated communication scheme, determine a location area of the external device based on a difference of a sequence number corresponding to the first timing and a sequence number corresponding to the second timing in the counted sequence number, and perform a designated function based at least in part on the determining.

An electronic device according to various example embodiments of the disclosure may include: a sensor module including at least one sensor configured to detect a state change of a structure, a communication interface including a first antenna and a second antenna and configured to communicate with an external device using a designated communication scheme, at least one processor operatively coupled with the sensor module and the communication interface, and at least one one memory operatively coupled with the at least one processor. The at least one memory may store instructions which, when executed, cause the at least one processor to: based on a change of sensing data of the sensor module, detect that a state of the structure is changed from an open state to a close state, count a first sequence number from a first timing at which the state of the structure is changed to the close state to a second timing after a designated time based on information received from the external device via the first antenna using the designated communication scheme, count a second sequence number from the first timing at which the state of the structure is changed to the close state to the second timing after the designated time based on information received from the external device via the second antenna using the designated communication scheme, determine a location area change of the external device based on a difference of a sequence number corresponding to the second timing of the first sequence number and a sequence number corresponding to the second timing of the second sequence number, and perform a designated function based at least in part on the determining.

An operating method of an electronic device including at least one antenna according to various example embodiments of the disclosure may include: detecting that a state of a structure is changed from an open state to a close state, counting a sequence number from a first timing at which the state of the structure is changed to the close state to a second timing after a designated time based on information received from an external device via the at least one antenna using a designated communication scheme, determining location information of the external device based on the sequence number, and performing a designated function based at least in part on the determined location information.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the present disclosure will be more apparent from the following detailed description, taken in conjunction with the accompanying drawings, in which:

FIG. 15B is a diagram illustrating an example first sequence number and the second sequence number if the location area of the external device is changed from the outside to the inside of the structure according to an embodiment of the disclosure;

Throughout the drawings, like reference numerals will be understood to refer to like parts, components and structures.

DETAILED DESCRIPTION

Figure 1:
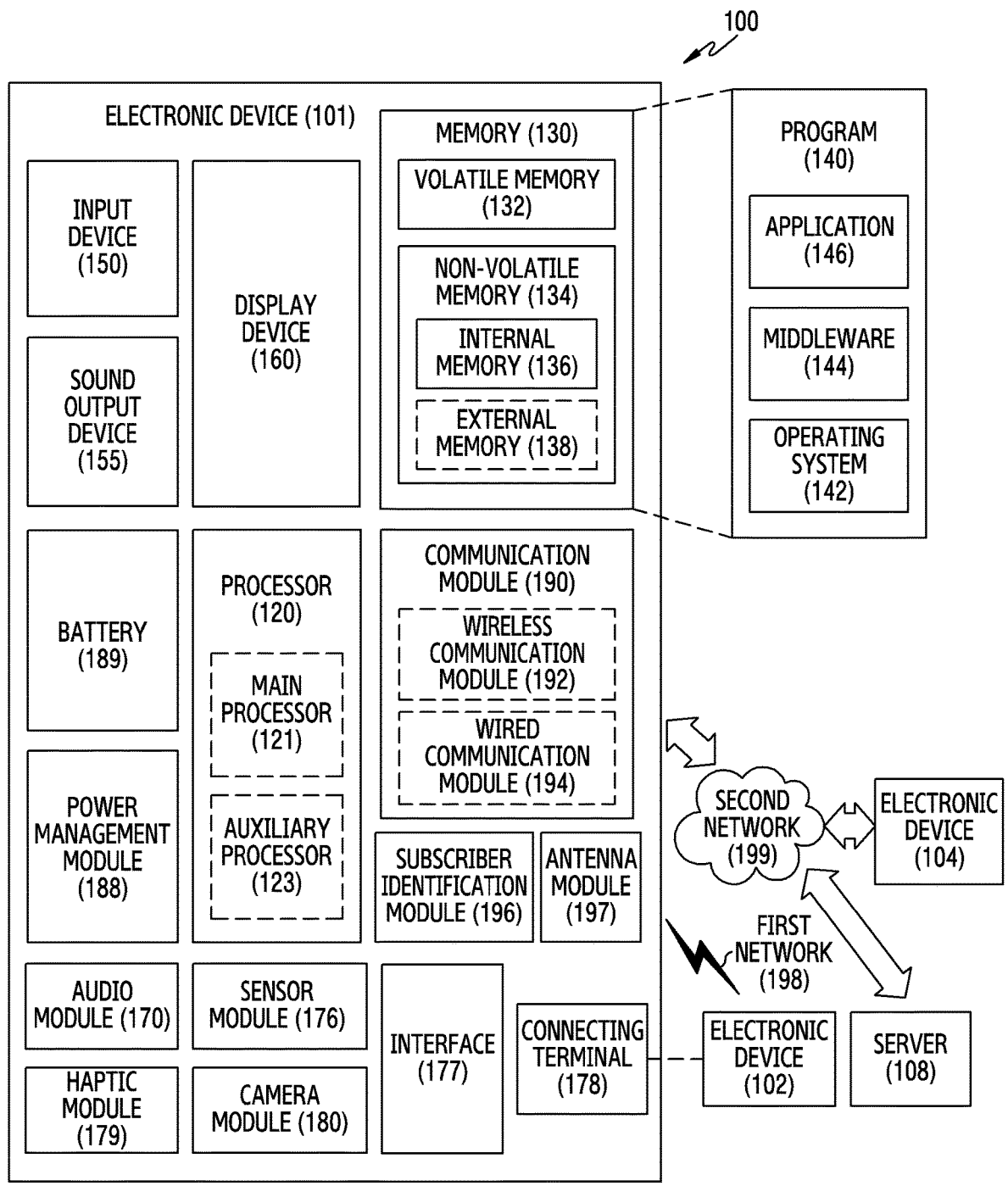
FIG. 1 is a block diagram illustrating an example electronic device in a network environment according to an embodiment of the disclosure.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an example embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
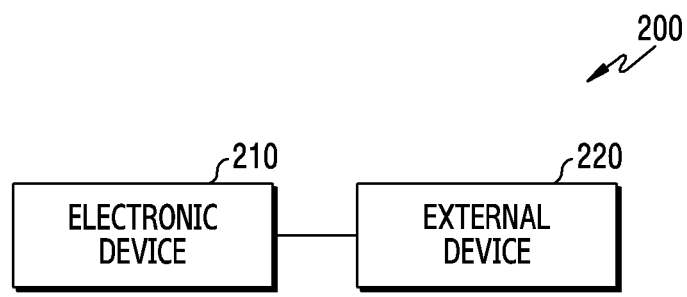
FIG. 2 is a block diagram illustrating an example relation of a plurality of electronic devices according to an embodiment of the disclosure.

FIG. 2 is a block diagram illustrating an example relation 200 of electronic devices according to various embodiments of the disclosure.

In an embodiment, an electronic device 210 may correspond to the electronic device 101 of FIG. 1. In an embodiment, the electronic device 210 may be installed (or secured) near a structure which may open and close. For example, the structure may be a door, and the electronic device 210 may be installed at a door, or at a frame close to the door.

In an embodiment, the electronic device 210 may perform wireless data communication with an external device 220, to acquire location information (e.g., location area information or location area change information) of the external device 200 which may move. In an embodiment, the electronic device 210 may periodically receive from the external device 220 data of a designated format associated with a designated communication scheme, or periodically identify whether a signal of a designated format is received. For example, the designated communication scheme may correspond to an ultra-wideband (UWB) communication scheme. For example, the signal of the designated format associated with the designated communication scheme may correspond to a poll signal for measuring a distance between the electronic device 210 and the external device 220. The electronic device 210 may function as an anchor of the UWB communication. The anchor of the UWB communication may refer, for example, to a device which determines location information of the external device, based on a signal associate with the UWB communication received from an external device (e.g., the external device 220) connected with the anchor.

In an embodiment, the external device 220 may be a movable electronic device. The external device 220 may correspond to the electronic device 102 of FIG. 1. the external device 220 may move, among two areas divided by the structure, from one area to the other area. For example, if the structure is a door and the structure separates an indoor area and an outdoor area, the external device 220 may move from the indoor area to the outdoor area, or from the outdoor area to the indoor area, by passing through the door. The external device 220 may function as a device (e.g., a tag of the UWB communication) for transmitting a signal associated with the UWB communication to the anchor, wherein the anchor of the UWB communication may determine the location information of the external device 220.

In an embodiment, the structure may, for example, and without limitation, be at least one of an inward opening door which opens inwards or an outward opening door which opens outwards. Hereafter, the structure which is the inward opening door is mainly described. However, the disclosure is not limited thereto, and various example embodiments of the disclosure may be applied, for example, and without limitation, to the structure which is the outward opening door or a sliding door, or may be applied through changes which may be easily inferred by those skilled in the art.

Figure 3:
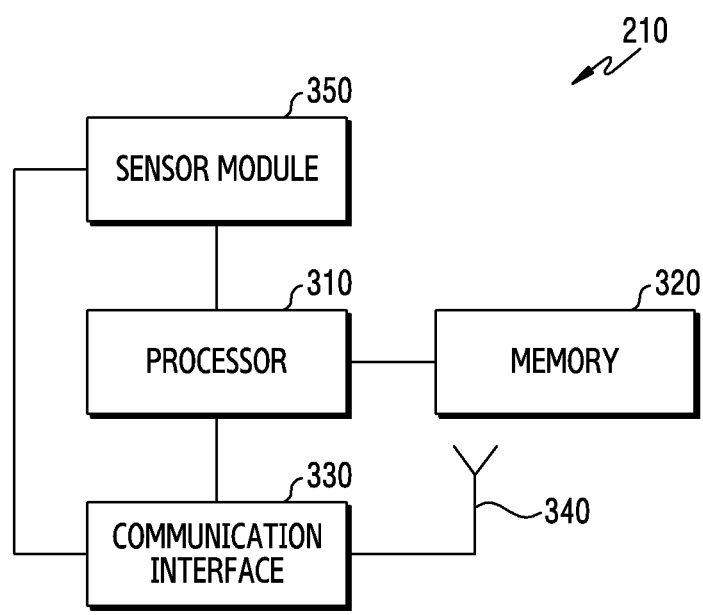
FIG. 3 is a block diagram illustrating an example electronic device according to an embodiment of the disclosure.

FIG. 3 is a block diagram illustrating an example electronic device according to various embodiments of the disclosure.

The electronic device 210 may include a processor (e.g., including processing circuitry) 310, a memory 320, a communication interface (e.g., including communication circuitry) 330, at least one antenna 340, and a sensor module (e.g., including at least one sensor) 350.

In an embodiment, the processor 310 may include various processing circuitry and control operations of the electronic device 210 for fulfilling various embodiments of the disclosure. For example, the processor 310 may correspond to the processor 120 of FIG. 1. The processor 310 may control at least one hardware module of the electronic device 210 to perform at least one operation, in a designated order. For example, the processor 310 may control the communication interface 330 to transmit data of a designated format associated with a designated communication scheme to an external device (e.g., the external device 220 of FIG. 2).

In an embodiment, the processor 310 may be operably or electrically connected with the communication interface 330 as shown in FIG. 3. For example, the processor 310 may be a main processor (e.g., an application processor).

In an embodiment, some operations of various example embodiments of the disclosure may be performed by, not the processor 310, but another processor (not shown) of the communication interface 330. For example, the communication interface 330 may include an auxiliary processor (e.g., a communication processor), and counting a sequence number may be performed by the auxiliary processor of the communication interface 330.

In an embodiment, the memory 320 may correspond to the memory 130 of FIG. 1. In an embodiment, the memory 320 may store commands (or a set of commands, or an application) for fulfilling various embodiments of the disclosure. For example, the memory 320 may store command for, if executed, causing the processor 310 or the processor (not shown) of the communication interface 330 to count the sequence number corresponding to a superframe of a designated time interval.

In an embodiment, the memory 320 may store setting information related to the designated communication scheme for the external device 220 or an external sensor device (e.g., an external sensor device 430 of FIG. 4), and necessary reference information (e.g., a first threshold in FIG. 9) according to an embodiment of the disclosure.

In an embodiment, the communication interface 330 may include various communication circuitry and exchange signals (or data) with the external device 220 using the designated communication scheme via the at least one antenna 340, under control of the processor 310. In an embodiment, the communication interface 330 may correspond to the communication module 190 or the wireless communication module 192 of FIG. 1.

In an embodiment, the designated communication scheme may, for example, and without limitation, be the UWB communication scheme.

In an embodiment, the communication interface 330 may include UWB communication circuitry. For example, the communication interface 330 may receive a poll signal for measuring the distance between the electronic device 210 and the external device 202, from the external device using the UWB communication circuitry, and transmit a response signal of the received poll signal to the external device 220.

Figure 4:
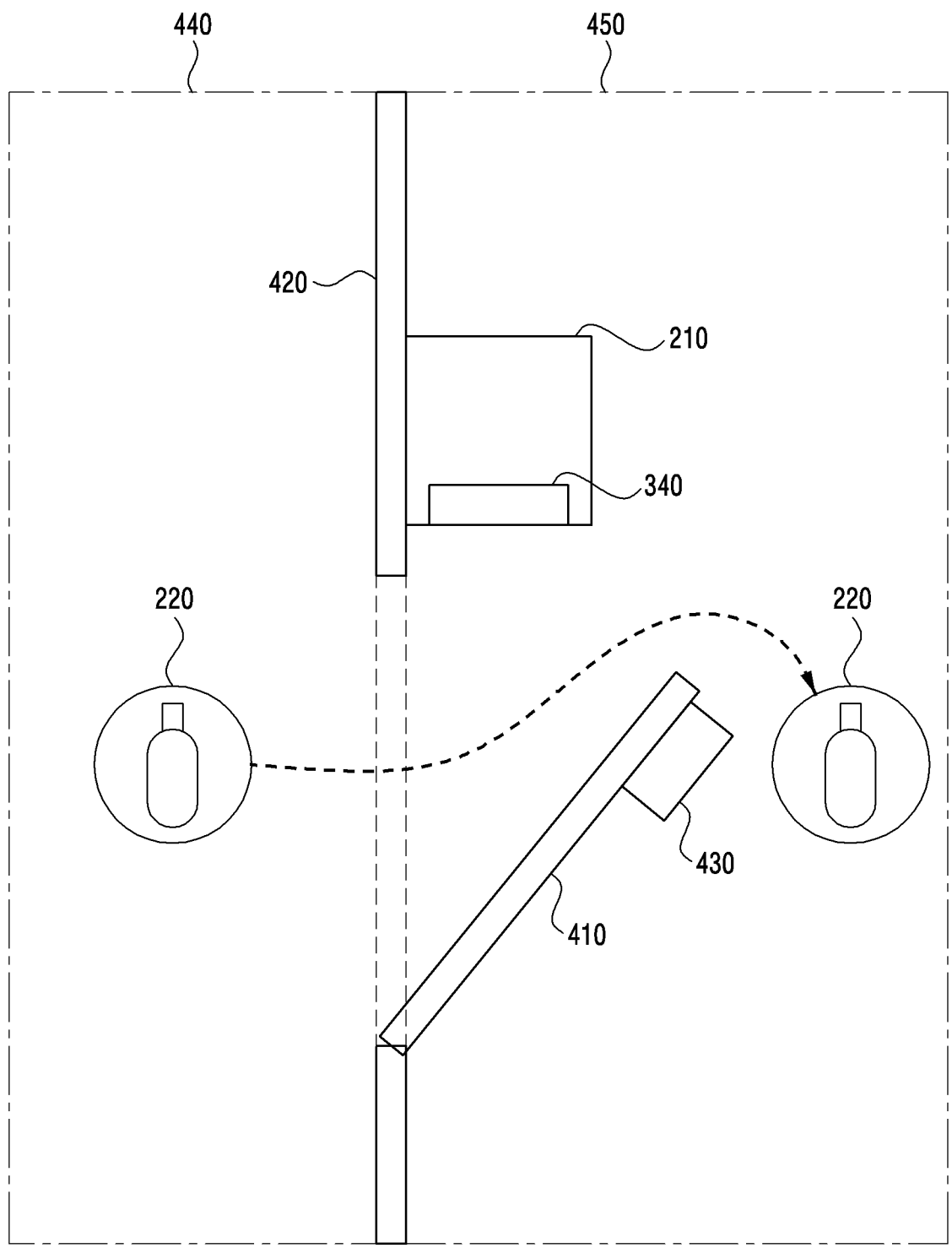
FIG. 4 is a diagram illustrating an example arrangement of a plurality of electronic devices and a structure according to an embodiment of the disclosure.

In an embodiment, the communication interface 330 may receive a signal from the external sensor device 430 (e.g., a magnet of FIG. 4). For example, the communication interface 330 may receive from the external sensor device 430 a signal including at least one of data used to detect a state change of the structure or data indicating the state change of the structure, and transmit the data of the received signal to the processor 310 or the sensor module 350.

In an embodiment, the communication interface 330 may enable the UWB communication circuitry, based on the signal (e.g., sensing data of the sensor module 350) resulting from the state change (e.g., a change from a close state to an open state) of the structure, under control of the auxiliary processor (e.g., the communication processor, not shown) of the communication interface 330. The communication interface 330 may count the sequence number using the enabled UWB communication circuitry, and transmit information of the counted sequence number to the processor 310.

In an embodiment, the at least one antenna 340 may correspond to the antenna module 197 of FIG. 1.

In an embodiment, the sensor module 350 may include at least one sensor for detecting the state change of the structure. For example, the sensor module 350 may include at least one sensor (e.g., a Hall sensor, a geomagnetic sensor) for detecting a magnetic field change of the external sensor device (e.g., the magnet) attached to the structure. Using information received from the external sensor device through the communication interface 330, the sensor module 350 may detect a magnetic field (or a magnetic field change) of the external sensor device, and generate sensing data. The sensing data of the sensor module 350 may be used for a processor (e.g., the processor 310, or the processor of the communication interface 330) to detect (or determine) the state change of the structure. For example, by use of the sensor module 350 or the sensing data of the sensor module 350, the processor 310 may detect that the state of the structure has been changed from the open state to the close state (or from the close state to the open state).

In an embodiment, the sensor module 350 may correspond to the sensor module 176 of FIG. 1.

Although not depicted, the electronic device 210 may include a display device (e.g., the display device 160) or an input interface (e.g., a keypad) for visually displaying content or a user interface.

FIG. 4 is a diagram illustrating an example arrangement of electronic devices and a structure according to various embodiments of the disclosure.

In an embodiment, a structure 410 may open or close. For example, the structure 410 may be a door. In an embodiment, the structure 410 may divide two areas. For example, an outside area 440 and an inside area 450 of the structure 410 may be divided. If the structure 410 is a door, the outside area 440 may be referred to as an outdoor area and the inside area 450 may be referred to as an indoor area.

In an embodiment, the electronic device 210 may be installed close to the structure 410. In an embodiment, the electronic device 210 may be disposed, attached, or installed at the frame 420, and the frame 420 may be close to the structure 410 with the structure 410 closed. The frame 420 may be a door frame. At least part of the frame 420 may be of a metal material. In another embodiment, the electronic device 210 may be installed on the structure 410 rather than the frame 420.

In an embodiment, the electronic device may be located in the indoor area 450.

In an embodiment, the external sensor device 430 may be disposed or attached on the structure 410.

In an embodiment, the external sensor device 430 may generate data used to detect a state change (e.g., a change from the close state to the open state, or a change from the open state to the close state) of the structure 410, and transmit the generated information to the electronic device 210. For example, the external sensor device 430 may include a magnet. The data may be used for the processor of the electronic device 210 to detect the state change of the structure 410.

In another embodiment, the external sensor device 430 may detect the state change of the structure 410, and transmit a signal including data indicating the state change of the structure 410 to the electronic device 210.

In another embodiment, the external sensor device 430 may periodically transmit to the electronic device 210 a signal of the state (e.g., the open state or the close state) of the structure 410. In another embodiment, only if detecting a state change event (e.g., an open event or a close event) of the structure 410, the external sensor device 430 may transmit a signal indicating the state change of the structure 410 to the electronic device 210.

In an embodiment, the external device 220 may move from one of the two areas 440 and 450 divided by the structure 410 to the other area, through a space between the opened structure 410 and the frame 420. As shown in FIG. 4, the external device 220 may move from the outdoor area 440 to the indoor area 450.

An electronic device (e.g., the electronic device 210) according to various example embodiments may include: a sensor module (e.g., the sensor module 350) including at least one sensor configured to detect a state change of a structure, a communication interface (e.g., the communication interface 330) including at least one antenna (e.g., the antenna 340) and configured to communicate with an external device using a designated communication scheme, at least one processor (e.g., the processor 310) operatively coupled with the sensor module and the communication interface, and at least one one memory (e.g., the memory 320) operatively coupled with the at least one processor. The at least one memory may store instructions which, when executed, cause the at least one processor to: based on a change of sensing data of the sensor module, detect that a state of the structure is changed from an open state to a close state, count a sequence number from a first timing at which the state of the structure is changed to the close state to a second timing after a designated time based on information received from the external device using the designated communication scheme, determine a location area of the external device based on a difference of a sequence number corresponding to the first timing and a sequence number corresponding to the second timing in the counted sequence number, and perform a designated function based at least in part on the determining.

According to various example embodiments, the electronic device may be located in a first area among the first area and a second area divided by the structure.

According to various example embodiments, the instructions, when executed, may cause the at least one processor to: as at least part of determining the location area of the external device based on the difference, based on the difference falling within a first range, determine the location area of the external device to the first area, and based on the difference falling within a second range different from the first range, determine the location area of the external device to the second area.

According to various example embodiments, the first range may be determined based on a first threshold, and the first threshold may be determined by a setting value related to the designated time and the designated communication scheme.

An electronic device (e.g., the electronic device 210) according to various example embodiments may include: a sensor module including at least one sensor (e.g., the sensor module 350) configured to detect a state change of a structure, a communication interface (e.g., the communication interface 330) including a first antenna and a second antenna and configured to communicate with an external device using a designated communication scheme, at least one processor (e.g., the processor 310) operatively coupled with the sensor module and the communication interface, and at least one one memory (e.g., the memory 320) operatively coupled with the at least one processor. The at least one memory may store instructions which, when executed, cause the at least one processor to: based on a change of sensing data of the sensor module, detect that a state of the structure is changed from an open state to a close state, count a first sequence number from a first timing at which the state of the structure is changed to the close state to a second timing after a designated time based on information received from the external device via the first antenna using the designated communication scheme, count a second sequence number from the first timing at which the state of the structure is changed to the close state to the second timing after the designated time based on information received from the external device via the second antenna using the designated communication scheme, determine a location area change of the external device based on a difference of a sequence number corresponding to the second timing of the first sequence number and a sequence number corresponding to the second timing of the second sequence number, and perform a designated function based at least in part on the determining.

According to various example embodiments, the designated communication scheme may include a UWB communication scheme.

According to various example embodiments, the sensor module may include a Hall sensor configured to sense a change of a magnetic field of an external sensor device.

According to various example embodiments, the external sensor device may be attached to the structure.

According to various example embodiments, the at least one processor may be included in the communication interface.

According to various example embodiments, the electronic device may be located in a first area among the first area and a second area divided by the structure.

According to various example embodiments, the instructions, when executed, may cause the at least one processor to: as at least part of determining the location area change based on the difference, based on the difference falling within a third range, determine that the location area is changed from the first area to the second area, and based on the difference falling within a fourth range different from the third range, determine that the location area is changed from the second area to the first area.

According to various example embodiments, the third range may correspond to a designated error range in a second threshold, and the second threshold may be zero.

According to various example embodiments, the electronic device may further include a display (e.g., the display 160) operatively coupled with the processor, and the instructions, when executed, may cause the at least one processor to: based on the difference not falling within the third range and the fourth range, control the display to display a notification that the change of the location area is not determined.

According to various example embodiments, the instructions, when executed, may cause the at least one processor to: as at least part of determining that the location area is changed from the first area to the second area, determine that the location area is changed from the first area to the second area, further based on at least one of a difference of a sequence number corresponding to the first timing and a sequence number corresponding to the second timing in the first sequence number or a difference of a sequence number corresponding to the first timing and a sequence number corresponding to the second timing in the second sequence number.

According to various example embodiments, the instructions, when executed, may cause the at least one processor to: as at least part of determining that the location area is changed from the second area to the first area, determine that the location area is changed from the second area to the first area, further based on at least one of a difference of a sequence number corresponding to the first timing and a sequence number corresponding to the second timing in the first sequence number or a difference of a sequence number corresponding to the first timing and a sequence number corresponding to the second timing in the second sequence number.

Figure 5A:
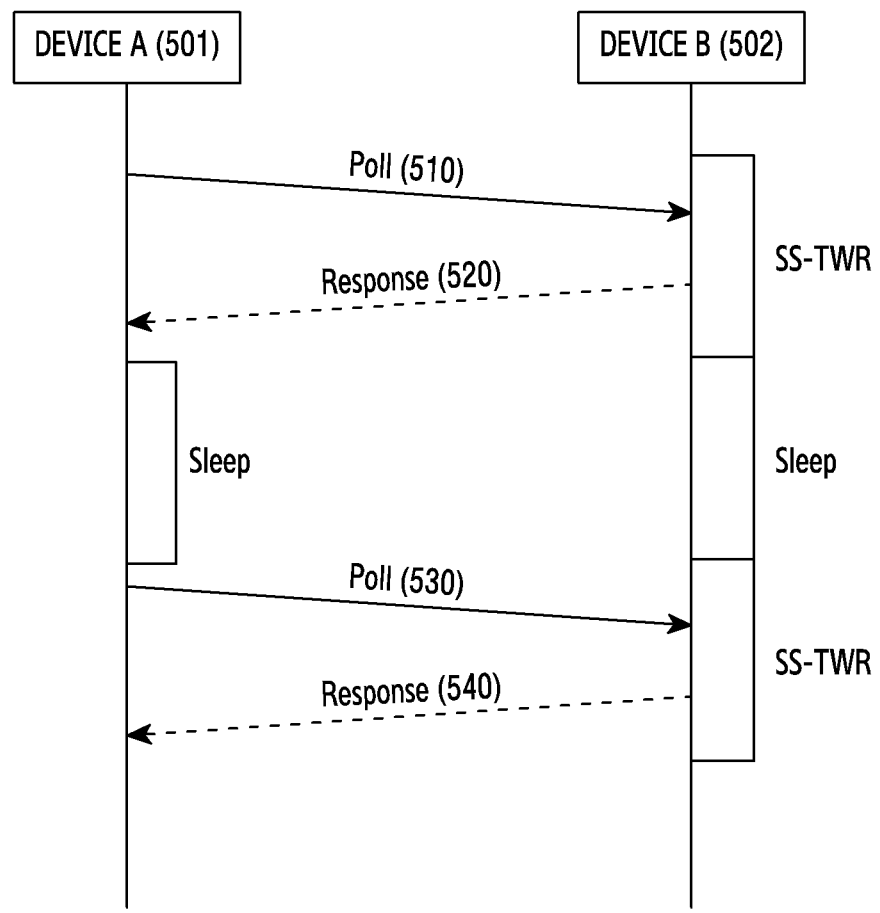
FIG. 5A is a signal flow diagram illustrating example signals transmitted and received between an electronic device and an external device in a single side two-way ranging (SS-TWR) system based on ultra-wideband (UWB) communication according to an embodiment of the disclosure.

FIG. 5A is a signal flow diagram illustrating example signals transmitted and received between an electronic device and an external device in a single side two-way ranging (SS-TWR) system based on UWB communication according to various embodiments of the disclosure.

In an embodiment, the electronic device 210 may exchange signals with the external device 220 based on a designated communication scheme (e.g., the UWB communication scheme).

In an embodiment, to measure a distance from the external 220, the electronic device 210 may perform distance measurement based on time of flight (ToF), for example, TWR (two-way ranging).

In an embodiment, a device A 501 which initiates ranging may transmit to a device B 502 a poll signal 510 for the distance measurement and receive a response signal 520. The device A 501 may calculate a signal travel time from the device A 501 to the device B 502 based on a transmission time of the poll signal 510, a reception time of the response signal, and an internal processing time of the device B 502, and measure the distance between the device A 501 and the device B 502 through physical calculation. In an embodiment, the device B 502 may transmit to the device A 501 response signals 520 and 540 including its internal processing time. In an embodiment, to reduce power consumption of the device, poll signals 510 and 530 may include a transmission time of a next poll signal. In this case, the device A 501 and the device B 502 may reduce the power consumption, by measuring the distance in the current SS-TWR system and then entering a sleep mode to minimize and/or reduce the power use until a next poll signal is transmitted.

In an embodiment, the response signals 520 and 540 may include two or more signals which are distinguished. For example, the device B 502 may transmit the response signal 520, by sequentially (or consecutively) transmitting a first response signal and a second response signal which correspond to different time intervals respectively.

According to the SS-TWR, the device A 501 may measure the distance but the device B 502 may not measure the distance.

In an embodiment, the device A 501 may correspond to the electronic device 201 and the device B 502 may correspond to the external device 220, and vice versa.

Figure 5B:
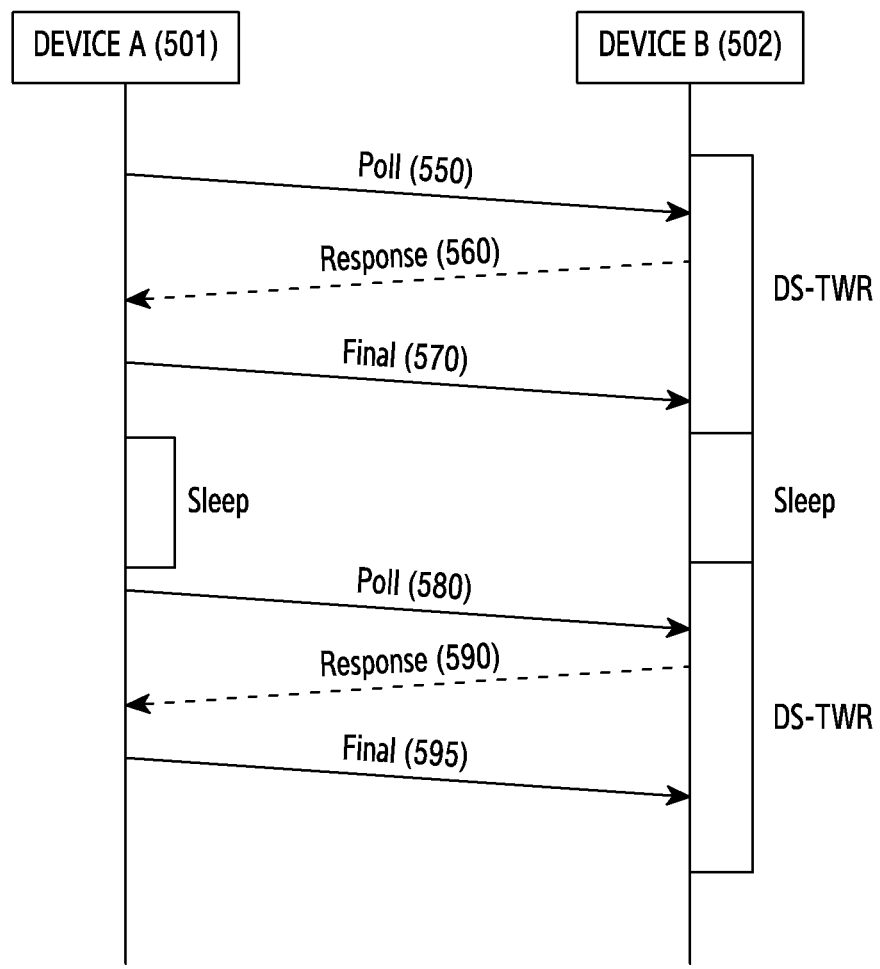
FIG. 5B is a signal flow diagram illustrating example signals transmitted and received between the electronic device and the external device in a double side two-way ranging (DS-TWR) system based on the UWB communication according to an embodiment of the disclosure.

FIG. 5B is a signal flow diagram illustrating example signals transmitted and received between the electronic device and the external device in a double side (DS)-TWR system based on the UWB communication according to various embodiments of the disclosure.

In an embodiment, the device A 501 which initiates the ranging may transmit poll signals 550 and 580 for the distance measurement, and receive response signals 560 and 590, and retransmit final signals 570 and 595. Accordingly, the device B 502 may receive the poll signals 550 and 580, transmit the response signals 560 and 590, and re-receive the final signals 570 and 595. The device A 501 may calculate the signal travel time from the device A 501 to the device B 502 and/or from the device B 502 to the device A 501 based on transmission times of the poll signals 550 and 580, reception times of the response signals 560 and 590, and the internal processing time of the device B 220, and measure the distance between the device A 501 and the device B 502 through physical calculation. The device B 502 may calculate the signal travel time from the device B 502 to the device A 501 based on the transmission times of the response signals 560 and 590, the reception times of the final signals 570 and 595, and an internal processing time of the device A 501, and measure the distance between the device A 501 and the device B 502 through physical calculation.

In an embodiment, the device B 502 may transmit to the device A 501 the response signals 560 and 590 including its internal processing time, and the device A 501 may transmit to the device B 502 the final signals 570 and 595 including its internal processing time. In an embodiment, to reduce the power consumption of the device, the response signal 560 and 590 may include a transmission time of a next poll signal. The device A 501 and the device B 502 may reduce the power consumption, by measuring the distance in the current DS-TWR system and then entering the sleep mode to minimize and/or reduce the power use until a next poll signal is transmitted.

In an embodiment, the response signals 560 and 590 may include two or more signals which are distinguished. For example, the device B 502 may transmit the response signal 560, by sequentially (or consecutively) transmitting a first response signal and a second response signal which correspond to different time intervals respectively.

According to the DR-TWR, the device A 501 and the device B 502 both may measure the distance.

In an embodiment, the device A 501 may correspond to the electronic device 201 and the device B 502 may correspond to the external device 220, and vice versa.

Figure 6:
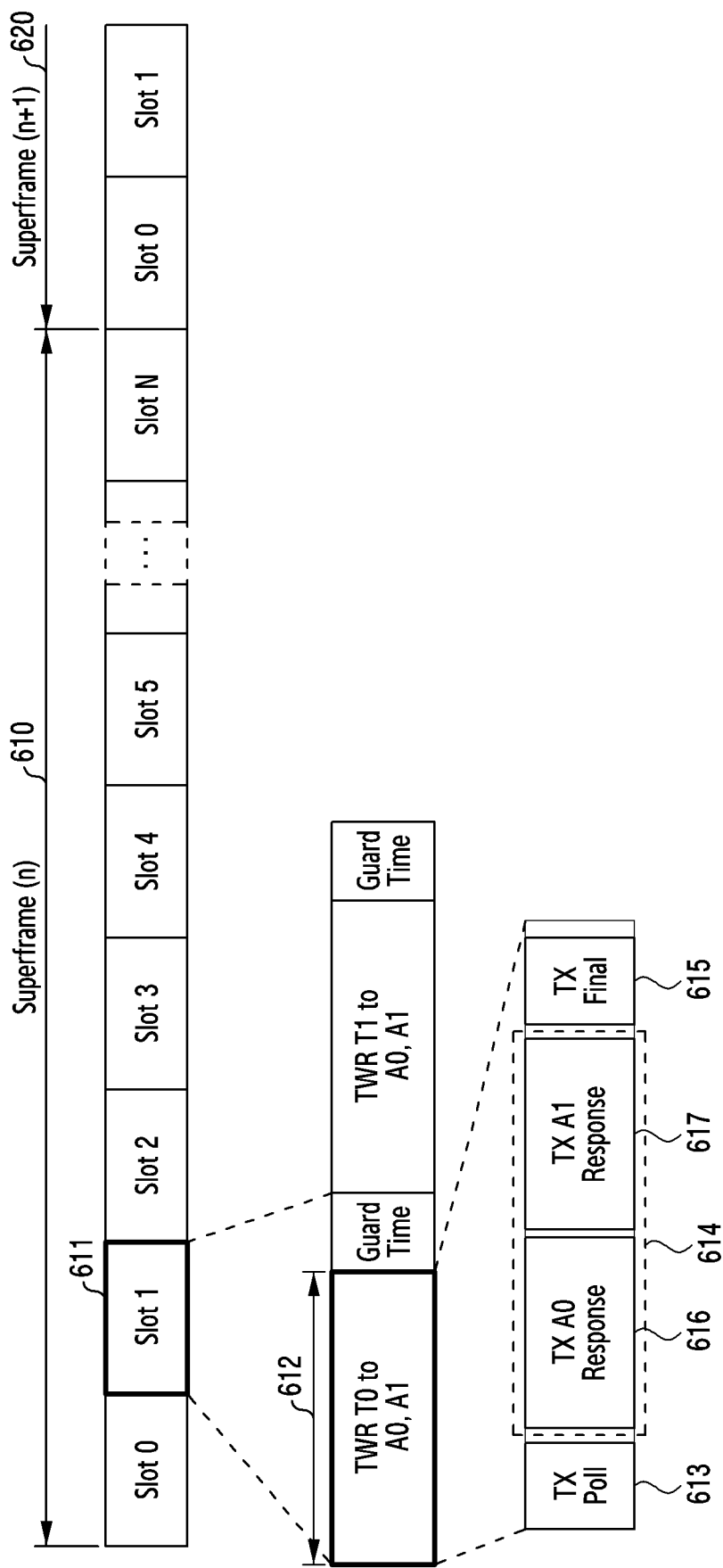
FIG. 6 is a diagram illustrating an example frame structure of a TWR system based on UWB communication according to an embodiment of the disclosure.

FIG. 6 is a diagram illustrating an example frame structure of a TWR system based on UWB communication according to various embodiments of the disclosure.

Referring to FIG. 6, a frame of the TWR system based on the UWB communication may have a hierarchical structure of a superframe 610 and a slot 611. The superframe 610 may include N-ary slots (e.g., the first slot 611). For example, the superframe 610 of 100 msec may include 10 slots of 10 msec. Different slots in one superframe 610 may correspond to different time resources (or time intervals).

In an embodiment, in a time interval corresponding to the one slot 611, the poll signal, the response signal, and the final signal of FIG. 5B may be transmitted and received between an electronic device (e.g., the electronic device 210) and an external device (e.g., the external device 220). For example, part 612 of the time interval corresponding to the one slot 611 may transmit and receive a poll signal 613, a response signal 614, and a final signal 615 between the electronic device 210 and the external device 220. In an embodiment, the response signal 614 may include a first response signal (TX A0 response) 616 and a second response signal (TX A1 response) 617 corresponding to different time intervals. Hence, based on the signals transmitted and received in the time interval corresponding to the one slot 611, the distance between the electronic device 210 and the external device 220 may be measured.

Although not depicted, in the time interval corresponding to the one slot 611, the poll signal and the response signal of FIG. 5A may be transmitted and received between the electronic device 210 and the external device 220. For example, the part 612 of the time interval corresponding to the one slot 611 may transmit and receive the poll signal and the response signal between the electronic device 210 and the external device 220. The response signal may include two or more signals corresponding to different time intervals.

In an embodiment, the electronic device 210 may determine a sequence number corresponding to a specific superframe. The electronic device 210 may determine the sequence number corresponding to the specific superframe, based on the number of designated signal (e.g., a response signal) receptions from the external device 220 in slots of the specific superframe and a sequence number corresponding to a previous superframe. For example, with respect to the specific superframe, if the number of the designated signal receptions from the external device 220 falls within a predesignated range (e.g., the number of the slots in the specific superframe, or a range with a designated error range for the number of the slots), the electronic device 210 may determine the sequence number corresponding to the specific superframe to a value (e.g., n+1) by adding a designated value (e.g., 1) to the sequence number (e.g., n) corresponding to the previous superframe. For example, with respect to the specific superframe, if the number of the designated signal receptions from the external device 220 does not fall within the predesignated range, the electronic device 210 may determine the sequence number corresponding to the specific superframe to the same value (e.g., n) as the sequence number (e.g., n) corresponding to the previous superframe.

Figure 7:
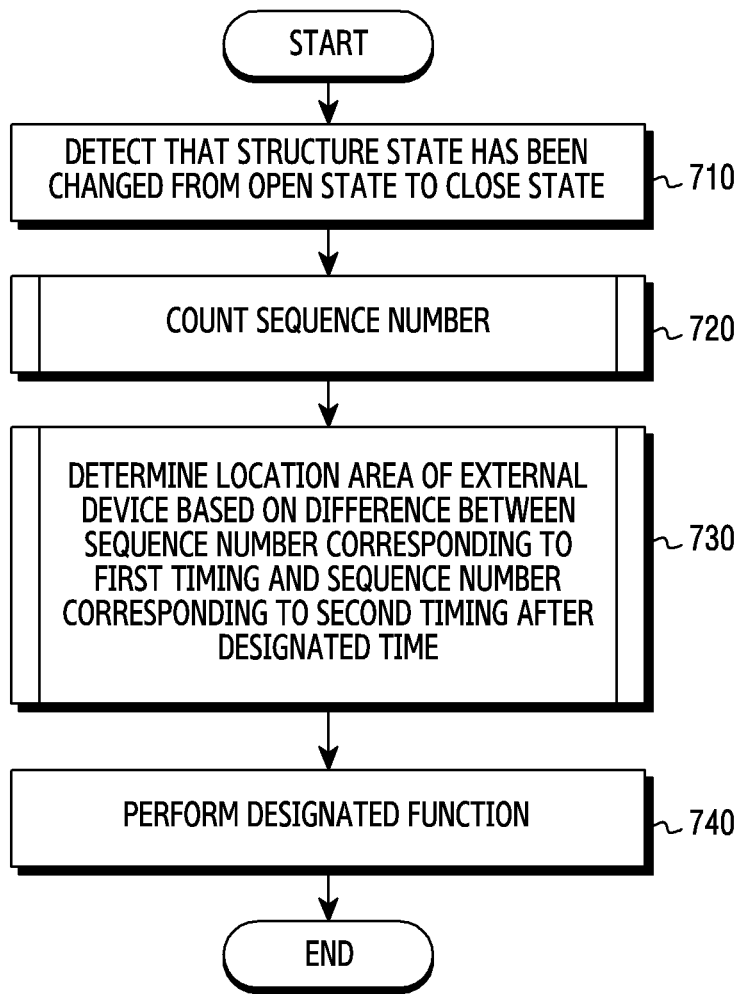
FIG. 7 is a flowchart illustrating example operations of an electronic device according to an embodiment of the disclosure.

FIG. 7 is a flowchart illustrating example operations of an electronic device according to various embodiments of the disclosure.

At least part of operations of FIG. 7 may be fulfilled by an electronic device (e.g., the electronic device 210) or a processor (e.g., the processor 310, the processor of the communication interface 330). In the following, it is described that the processor 310 performs the operations of FIG. 7.

In operation 710, the processor 310 may detect that the state of the structure has been changed from the open state to the close state.

In an embodiment, the processor 310 may detect (or identify) that the state of the structure 410 has been changed from the open state to the close state, using sensing data of a sensor module (e.g., the sensor module 350).

In another embodiment, the processor 310 may identify a signal indicating the state change of the structure 410, received from an external sensor device (e.g., the external sensor device 430) through the communication interface 330.

In operation 720, the processor 310 may count a sequence number.

In an embodiment, the processor 310 may count the sequence number using information received through the communication interface 330.

In an embodiment, the processor 310 may count the sequence number in a designated time interval.

In an embodiment, the processor 310 may sequentially determine the sequence number corresponding to at least one superframe in the designated time interval.

In an embodiment, the processor 310 may count the sequence number, from the timing of the structure close detection (hereafter, referred to as a first timing) to a timing (hereafter, referred to as a second timing) after a predetermined time.

In an embodiment, the processor 310 may initiate the sequence number counting from the first timing, initiate the sequence number counting before the first timing, and count the sequence number until the second timing. For example, the processor 310 may enable the communication interface 330 in response to identifying that the structure state has been changed from the close state to the open state before the first timing, and initiate the sequence number counting using the enabled communication interface 330.

In operation 730, the processor 310 may determine a location area of an external device based a difference (e.g., a value acquired by subtracting the sequence number corresponding to the first timing from the sequence number corresponding to the second timing) between the sequence number corresponding to the first timing and the sequence number corresponding to the second timing which is behind a designated time from the first timing.

In an embodiment, the location area of the external device may be any one of two areas (e.g., the inside area and the outside area) divided by the structure 410.

In an embodiment, the sequence number corresponding to the first timing may be a sequence number of a superframe including the first timing, and the sequence number corresponding to the second timing may be a sequence number of a superframe including the second timing.

In operation 740, the processor 310 may perform a designated function. The processor 310 may perform the designated function, using information of the determined location area of the external device 220. For example, based on determining that the location area of the external device 220 is the inside area, the processor 310 may change a property (e.g., change a television (TV) from power off to power on) related to enabling at least one external device in the inside area 450.

Figure 8:
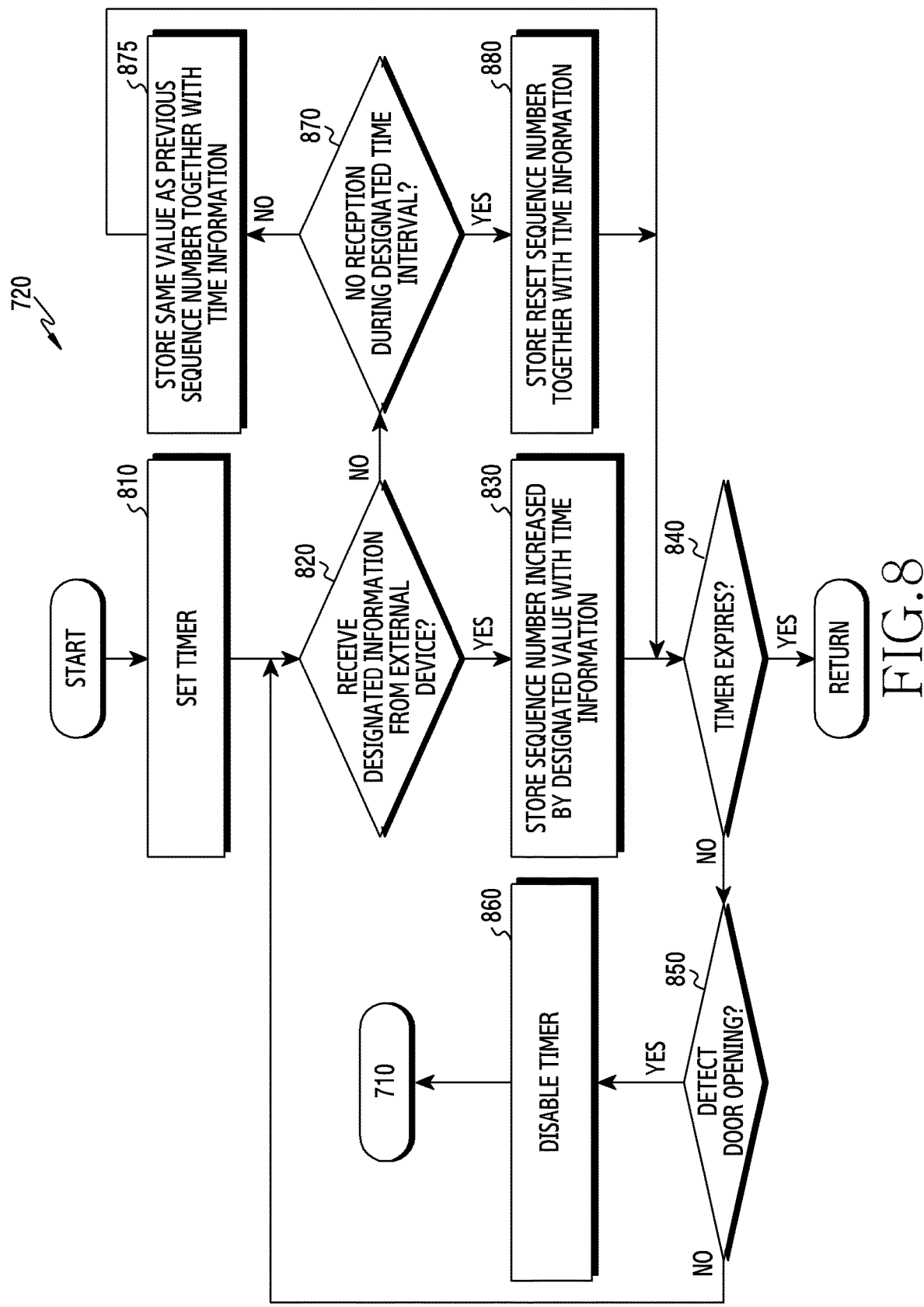
FIG. 8 is a flowchart illustrating example operations of an electronic device for counting a sequence number according to an embodiment of the disclosure.

FIG. 8 is a flowchart illustrating example operations of an electronic device for counting a sequence number according to various embodiments of the disclosure.

At least part of operations of FIG. 8 may be fulfilled by an electronic device (e.g., the electronic device 210) or a processor (e.g., the processor 310, the processor of the communication interface 330).

FIG. 8 may illustrate an example of operation 720 of FIG. 7.

In an embodiment, in operation 810, the processor 310 may set a timer. The processor 310 may set a time for enabling the timer. For example, the processor 310 may set the timer activation time to a predetermined time (e.g., 2 seconds).

In an embodiment, in operation 820, the processor 310 may identify whether information of a designated format is received from the external device 220. If receiving the information of the designated format from the external device 220, the processor 310 may perform operation 830. Otherwise, the processor 310 may perform operation 870. For example, with respect to a designated number of (e.g., one or two) superframe, the processor 310 may determine the number of designated information (e.g., signal) receptions from the external device 220, and identify whether the determined number of times falls within a predesignated range (e.g., the number of slots in a corresponding superframe). If the determined number of times falls within the predesignated range, the processor 310 may perform operation 830.

In an embodiment, in operation 830, the processor 310 may store a sequence number increased by a designated value (e.g., 1) together with time information. The processor 310 may set a value acquired by adding a designated value to a previous sequence number (e.g., a sequence number corresponding to a previous superframe) as a sequence number corresponding to a current superframe, and store the set sequence number mapped with the time information (e.g., time information associated with the current superframe) in the memory 320.

In an embodiment, in operation 870, the processor 310 may identify whether the information of the designated format is not received in a designated time interval. The processor 310 may identify whether no reception of the information of the designated format is maintained during the designated time interval, and perform operation 880 if no reception is maintained during the designated time interval. If no reception of the information of the designated format is not maintained during the designated time interval, the processor 310 may perform operation 875. For example, if no reception of the information of the designated format is maintained during three consecutive superframes (or for 0.3 seconds), the processor 310 may perform operation 880.

In an embodiment, in operation 875, the processor 310 may store the same value as the previous sequence number, together with time information. The processor 310 may store the same value as the sequence number corresponding to the previous sequence number, as a sequence number corresponding to a current superframe, and store the set sequence number mapped with the time information (e.g., time information associated with the current superframe) in the memory 320.

In an embodiment, in operation 880, the processor 310 may store the reset sequence number, together with the time information. Based on determining no reception of the designated information during the designated time interval, the processor 310 may set the sequence number corresponding to the current superframe as a reference value (e.g., 0), and store the set sequence number mapped with the time information (e.g., time information associated with the current superframe) in the memory 320.

In an embodiment, after any one of operations 830, 880 and 875, the processor 310 may identify whether the timer has expired in operation 840. If the time expires, the processor 310 may perform operation 730 of FIG. 7, and if the time does not expire, the processor 310 may identify whether door opening is detected in operation 850.

Although not illustrated, after operation 880, the processor 310 may finish the corresponding algorithm, without performing operation 840 (and/or other operation).

In an embodiment, if the door opening is not detected in operation 850, the processor 310 may return to operation 820. In an embodiment, if detecting the door opening before the timer expires, the processor 310 may disable the timer 860 and return to operation 710.

Through the operations of FIG. 8, the processor 310 may determine a sequence number corresponding to at least one superframe of a designated time interval where the time is set (or the time is enabled).

Figure 9:
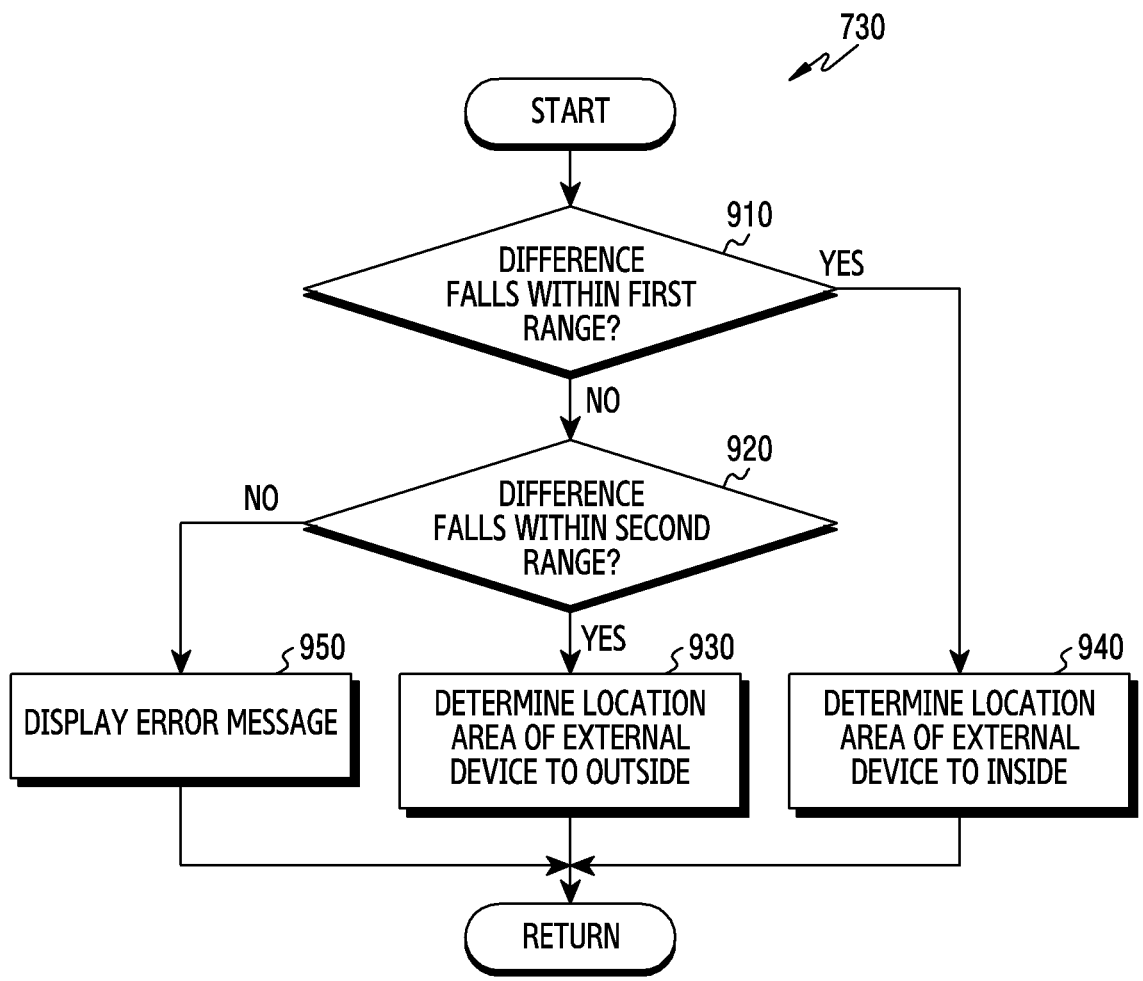
FIG. 9 is a flowchart illustrating example operations of an electronic device for determining a location area of an external device according to an embodiment of the disclosure.

FIG. 9 is a flowchart illustrating example operations of an electronic device for determining a location area of an external device according to various embodiments of the disclosure.

At least part of operations of FIG. 9 may be fulfilled by an electronic device (e.g., the electronic device 210) or a processor (e.g., the processor 310, the processor of the communication interface 330).

FIG. 9 may illustrate an example of operation 730 of FIG. 7.

In an embodiment, the processor 310 may identify a difference of a sequence number corresponding to a second timing and a sequence number corresponding to a first timing, and identify whether the identified difference falls within a first range (e.g., 18 through 22), in operation 910.

Figure 10A:
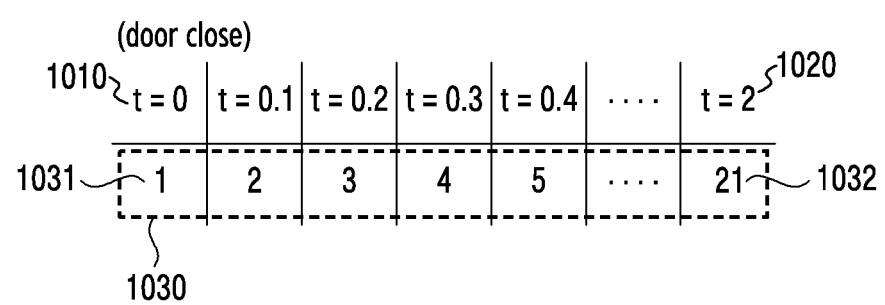
FIG. 10A is a diagram illustrating example sequence numbers counted from a first timing to a second timing if an external device is located inside a structure according to an embodiment of the disclosure.

For example, the processor 310 may identify 20 which is a difference between a sequence number 1032 corresponding to a second timing 1020 and a sequence number 1031 corresponding to a first timing 1010 in counted sequence numbers 1030 of FIG. 10A, and identify that the identified different falls within the first range.

Figure 10B:
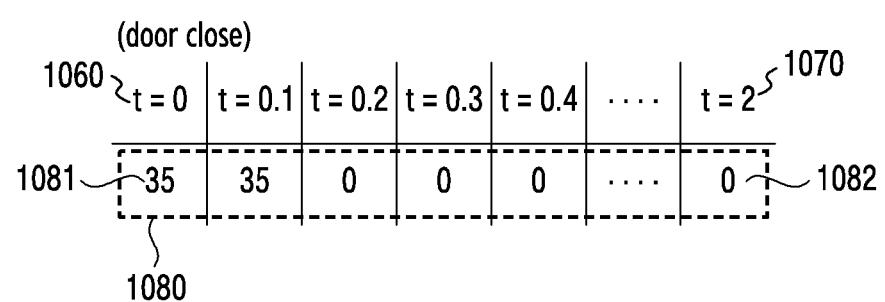
FIG. 10B is a diagram illustrating example sequence numbers counted from the first timing to the second timing if the external device is located outside the structure according to an embodiment of the disclosure.

For example, the processor 310 may identify −35 as a difference between a sequence number 1082 corresponding to a second timing 1070 and a sequence number 1081 corresponding to a first timing 1060 in counted sequence numbers 1080 of FIG. 10B, and identify that the identified different does not fall within the first range.

In an embodiment, the first range may reflect a designated error range of a first threshold, and the first threshold may be determined by lengths of a time interval between the first timing and the second timing and a time interval corresponding to one superframe. Specifically, the first threshold may be determined by the number of superframes in the time interval between the first timing and the second timing. For example, if the time interval between the first timing and the second timing is 2 seconds and the time interval corresponding to one superframe is 0.1 seconds, the first threshold may be determined to 20. This is because 20 superframes are included in 2 seconds.

In an embodiment, if identified different falls within the first range (e.g., is equal to the first threshold (e.g., 20)), the processor 310 may determine the location area of the external device 220 to the inside (or the inside area 450) of the structure 410.

Figure 11A:
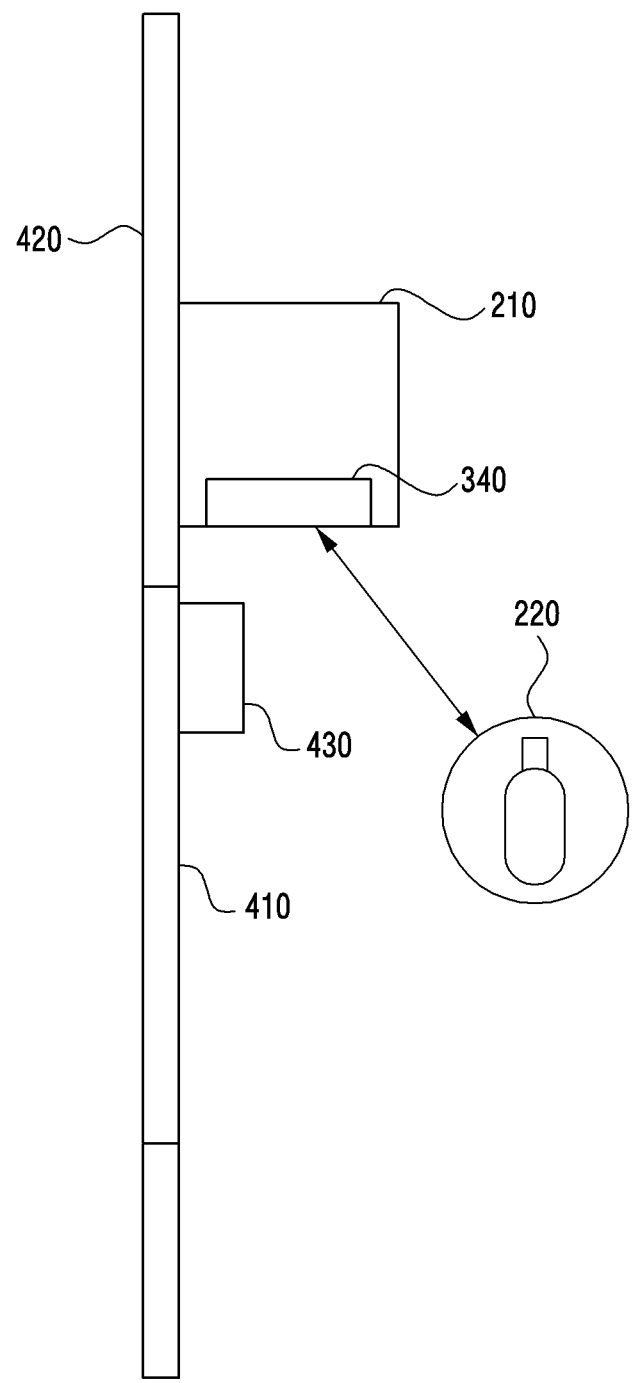
FIG. 11A is diagram illustrating an example relation of an electronic device and an external device if the external device is located inside a structure according to an embodiment of the disclosure.

The location area of the external device 220 may be determined in operation 940 to the inside of the structure 410 if the identified different falls within the first range, because line of sight may be maintained between the external device 220 and the electronic device 210, precisely, between the external device 220 and at least one antenna (e.g., the at least one antenna 340) only if the external device 220 is located inside (see FIG. 11A). Only if the line of sight is maintained, the sequence number counted by the electronic device 210 may increase gradually (by a designated value). If the external device 220 moves from the outside area 440 to the inside area 450 and the user closes the structure 410, since the line of sight between the electronic device 210 and the external device 220 is maintained during the time interval from the first timing to the second timing, the electronic device 210 may periodically receive the information of the designated format from the external device 220 in the time interval and thus gradually increase the sequence number corresponding to at least one superframe in the time interval. In this case, the difference of the sequence number corresponding to the second timing and the sequence number corresponding to the first timing may be equal to the first threshold, or may fall within the first range. This is because the first threshold corresponds to the number of superframes in the time interval from the first timing to the second timing.

In an embodiment, if the identified difference does not fall within the first range, the processor 310 may identify whether the identified difference falls within a second range, in operation 920.

In an embodiment, the second range may be determined by a second threshold, and the second threshold may be 0. The second range may not overlap with at least in part the first range. For example, the second range may be equal to or smaller than 0, or may reflect a designated error range in 0.

In an embodiment, if the identified difference falls within the second range, the processor 310 may determine the location area of the external device 220 to the outside (or the outside area 440) of the structure 410, in operation 930.

Figure 11B:
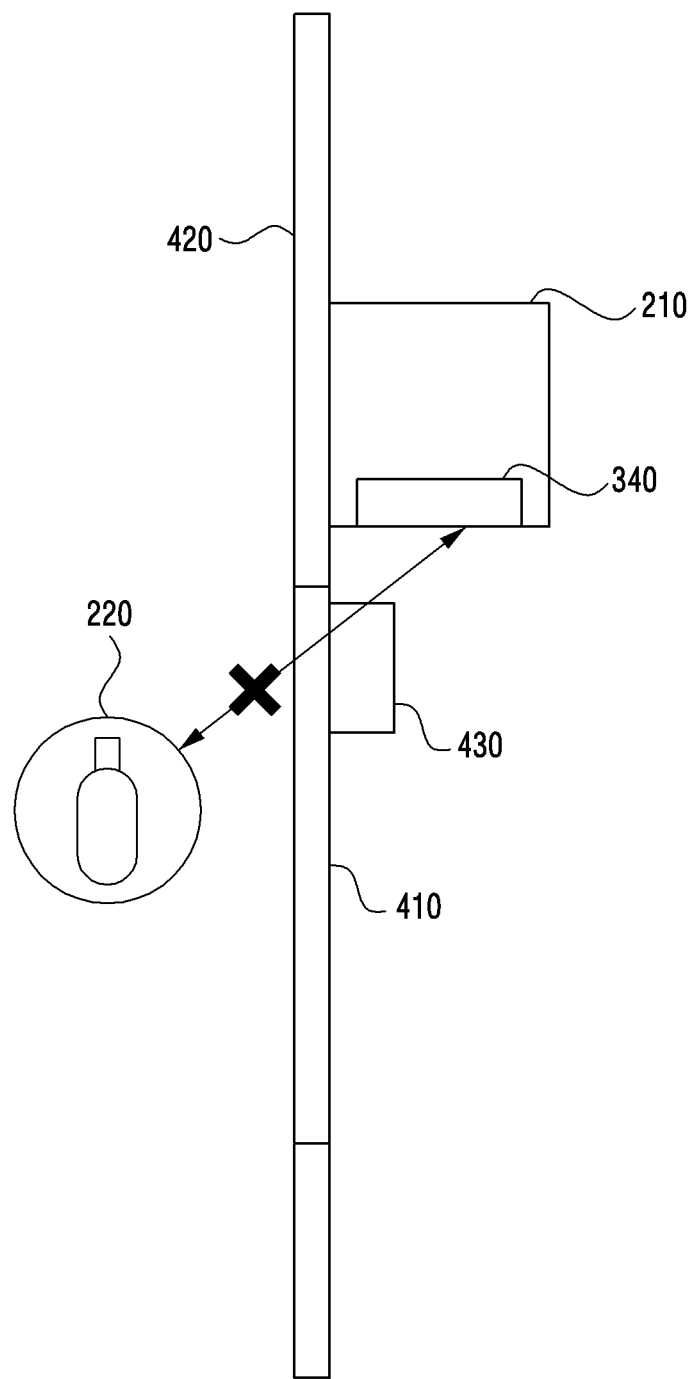
FIG. 11B is a diagram illustrating an example relation of the electronic device and the external device if the external device is located outside the structure according to an embodiment of the disclosure.

If the identified difference falls within the second range, the processor 310 may determine the location area of the external device 220 to the outside of the structure 410, because line of sight may not be maintained between the external device 220 and the electronic device 210, precisely, between the external device 220 and at least one antenna (e.g., the at least one antenna 340) only if the external device 220 is located outside (see FIG. 11B). If the line of sight is not maintained, the information of the designated format periodically transmitted from the external device 220 may be blocked by the metal structure 410 and/or the metal frame 420 and thus may not be successfully transmitted to the electronic device 210. As a result, the electronic device 210 may merely maintain the sequence number as a previous value (operation 875 of FIG. 8), or merely reset the the sequence number to a reference value (operation 880 of FIG. 8), without gradually increasing the sequence number by the designated value. In this case, the difference of the sequence number corresponding to the second timing and the sequence number corresponding to the first timing may be equal to or smaller than 0.

In an embodiment, if the identified difference does not fall within the second range (e.g., is greater than an upper bound of the first range), the processor 310 may control a display (e.g., the display 160) to display an error message indicating that the location area of the external device 220 is not determined, in operation 950.

Figure 12:
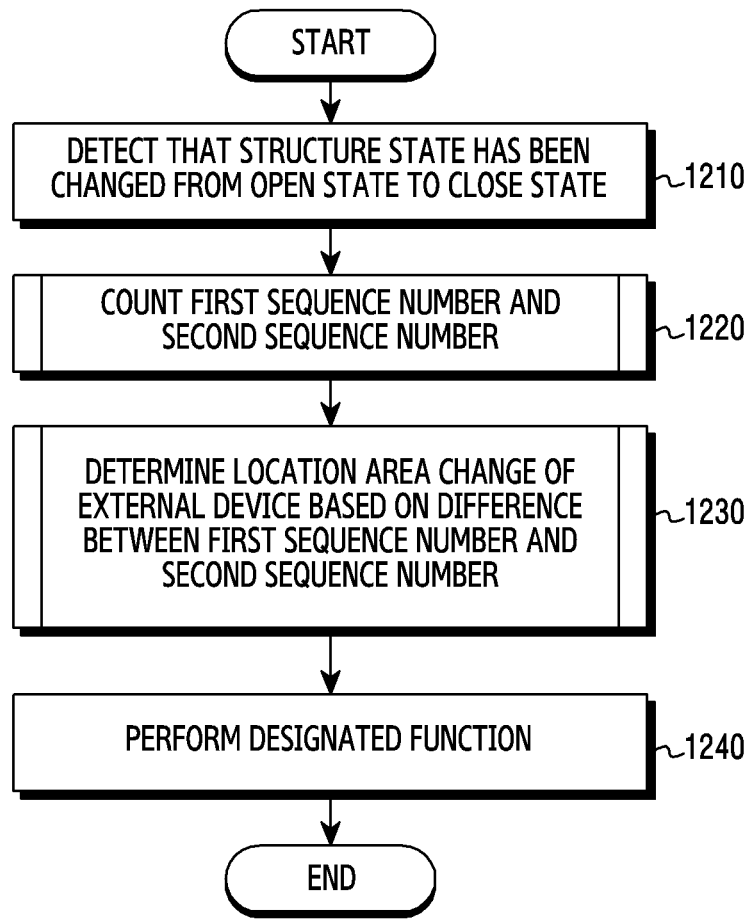
FIG. 12 is a flowchart illustrating example operations of an electronic device for determining a change of a location area of an external device using at least two antennas according to an embodiment of the disclosure.

FIG. 12 is a flowchart illustrating example operations of an electronic device for determining a change of a location area of an external device using at least two antennas according to various embodiments of the disclosure.

Operations of FIG. 12 may be fulfilled by the electronic device 210 including two or more antennas. For example, the at least one antenna 340 may include a first antenna and a second antenna. The first antenna and the second antenna may be disposed at different locations in the electronic device 210. For example, the first antenna may be disposed closer to the frame 420 than the second antenna.

At least part of operations of FIG. 12 may be fulfilled by an electronic device (e.g., the electronic device 210) or a processor (e.g., the processor 310, the processor of the communication interface 330).

In an embodiment, the processor 310 may detect that a state of a structure has been changed from the open state to the close state in operation 1210.

In an embodiment, operation 1210 may be substantially identical to operation 710 of FIG. 7.

In an embodiment, the processor 310 may count a first sequence number and a second sequence number in operation 1220.

Figure 14A:
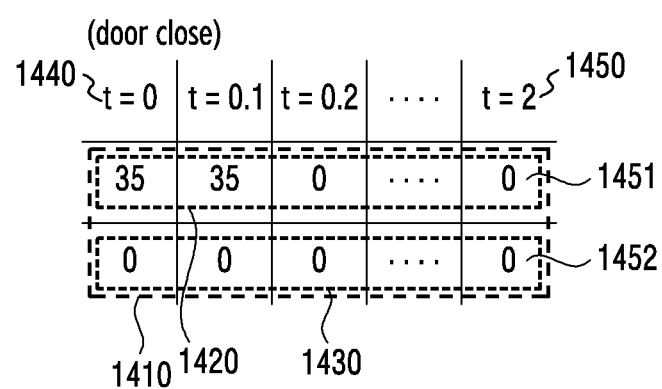
FIG. 14A is a diagram illustrating an example first sequence number and a second sequence number counted from a first timing to a second timing if an external device is located outside a structure according to an embodiment of the disclosure.
Figure 14B:
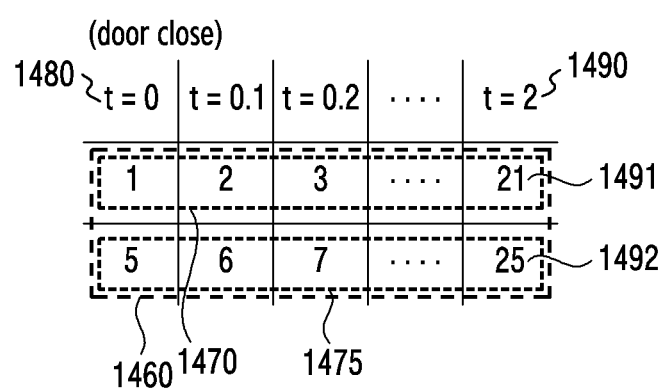
FIG. 14B is a diagram illustrating an example first sequence number and the second sequence number counted from the first timing to the second timing if the external device is located inside the structure according to an embodiment of the disclosure.

In an embodiment, the first sequence number may be counted based on information received from the external device 220 via the first antenna, and the second sequence number may be counted based on information received from the external device 220 via the second antenna. A first sequence number 1420 and a second sequence number 1430 are shown in FIG. 14A, and a first sequence number 1470 and a second sequence number 1475 are shown in FIG. 14B.

In an embodiment, counting the first sequence number and counting the second sequence number may be performed sequentially or simultaneously.

In an embodiment, one of counting the first sequence number and counting the second sequence number may include at least one operation of FIG. 8.

In an embodiment, the processor 310, in operation 1230, may determine a location area change of the external device, based a difference between sequence numbers corresponding to a second timing, among the first sequence number and the second sequence number. In an embodiment, the second timing may be after a designated time (e.g., 2 seconds) from a first timing at which the structure is closed. For example, the processor 310 may determine the location area change of the external device, based a value acquired by subtracting the sequence number corresponding to the second timing of the first sequence number from the sequence number corresponding to the second timing of the second sequence number.

In an embodiment, the processor 310 may perform a designated function in operation 1240. The processor 310 may perform the designated function, using information of the determined location area change of the external device 220. For example, based on determining that the location area of the external device 220 has been changed from the outside area 440 to the inside area 450, the processor 310 may change (e.g., change a TV from power off to power on) a property related to enabling at least one external device in the inside area 450.

Figure 13:
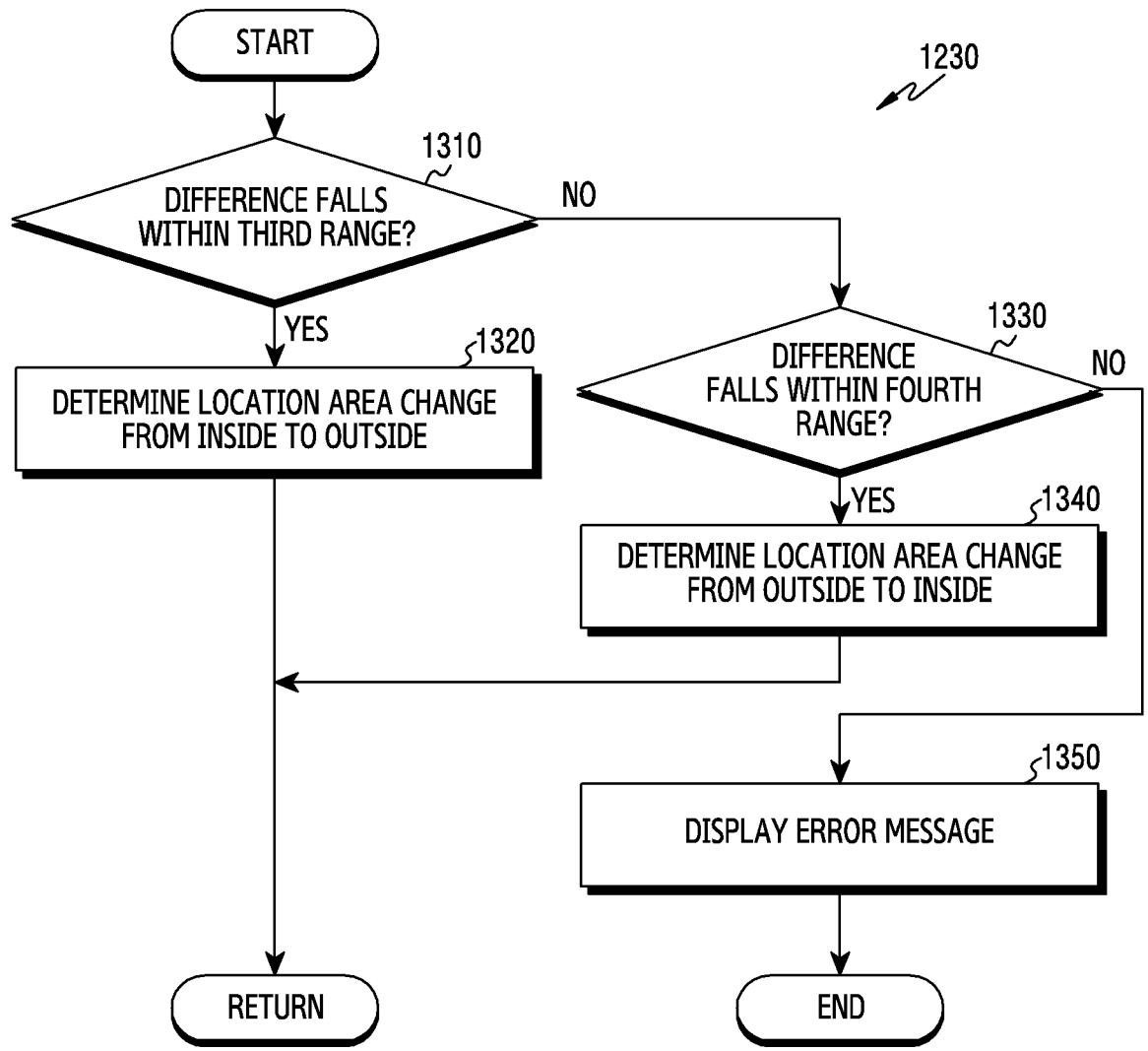
FIG. 13 is a flowchart illustrating example operations of an electronic device for determining a change of a location area of an external device according to an embodiment of the disclosure.

FIG. 13 is a flowchart illustrating example operations of an electronic device for determining a change of a location area of an external device according to various embodiments of the disclosure.

FIG. 13 may illustrate an example of operation 1230 of FIG. 12.

At least part of operations of FIG. 13 may be fulfilled by an electronic device (e.g., the electronic device 210) or a processor (e.g., the processor 310, the processor of the communication interface 330).

In an embodiment, in operation 1310, the processor 310 may identify a value by subtracting a sequence number corresponding to a second timing of a first sequence number, from a sequence number corresponding to the second timing of a second sequence number, and identify whether the identified difference falls within a third range (e.g., −2 through 2).

For example, referring to FIG. 14A, the processor 310 may identify 0 as a difference of a sequence number 1452 corresponding to a second timing 1450 of a second sequence number 1430 and a sequence number 1451 corresponding to the second timing 1450 of a first sequence number 1420, and identify that the difference falls within the third range.

For example, referring to FIG. 14B, the processor 310 may identify 4 as a difference of a sequence number 1492 corresponding to a second timing 1490 of a second sequence number 1475 and a sequence number 1491 corresponding to the second timing 1490 of a first sequence number 1470, and identify that the difference does not fall within the third range.

In an embodiment, the third range may reflect a designated error range in the second threshold, and the second threshold may be zero.

In an embodiment, if the identified difference falls within the third range, the processor 310 may determine the location area change of the external device 220 from the inside to the outside in operation 1320. For example, referring to FIG. 14A, since zero is produced by subtracting the sequence number 1451 corresponding to the second timing 1450 of the first sequence number 1420 from the sequence number 1452 corresponding to the second timing 1450 of the second sequence number 1430, the processor 310 may determine the location area change of the external device 220 from the inside to the outside. If the location area of the external device 220 is changed from the inside to the outside, line of sight between the first antenna (and the second antenna) and the external device 220 is not maintained from the first timing 1440, and the first sequence number 1420 and the second sequence number 1430 are reset before the second timing 1450 arrives and does not increase, considering the time interval between the first timing 1440 and the second timing 1450.

In an embodiment, if the identified difference does not fall within the third range, the processor 310 may identify whether the identified difference falls within a fourth range, in operation 1330.

In an embodiment, the fourth range may not overlap at least in part with the third range. For example, the fourth range may be greater than an upper bound (e.g., 2) of the third range.

In an embodiment, if the identified difference falls within the fourth range, the processor 310 may determine the location area change of the external device 220 from the outside to the inside in operation 1340. For example, referring to FIG. 14B, since 4 is produced by subtracting the sequence number 1491 corresponding to the second timing 1490 of the first sequence number 1470 from the sequence number 1492 corresponding to the second timing 1490 of the second sequence number 1475, the processor 310 may determine the location area change of the external device 220 from the outside to the inside. If the location area of the external device 220 is changed from the outside to the inside, the line of sight between the first antenna (and the second antenna) and the external device 220 may be maintained (e.g., a fourth state 15K of FIG. 15B), the line of sight is restored later, the line of sight at a first antenna 1501 and the line of sight at a second antenna 1502 are restored at different timings, but the timing of restoring the second antenna 1502 precedes the timing of restoring the first antenna 1501.

In an embodiment, if the identified difference does not fall within the fourth range, the processor 310 may display an error message in operation 1350. For example, if the identified difference does not fall within the third range and the fourth range (e.g., is smaller than a lower bound of the third range), the processor 310 may control a display (e.g., the display 160) to display the error message indicating that the location area change is not determined.

Figure 15A:
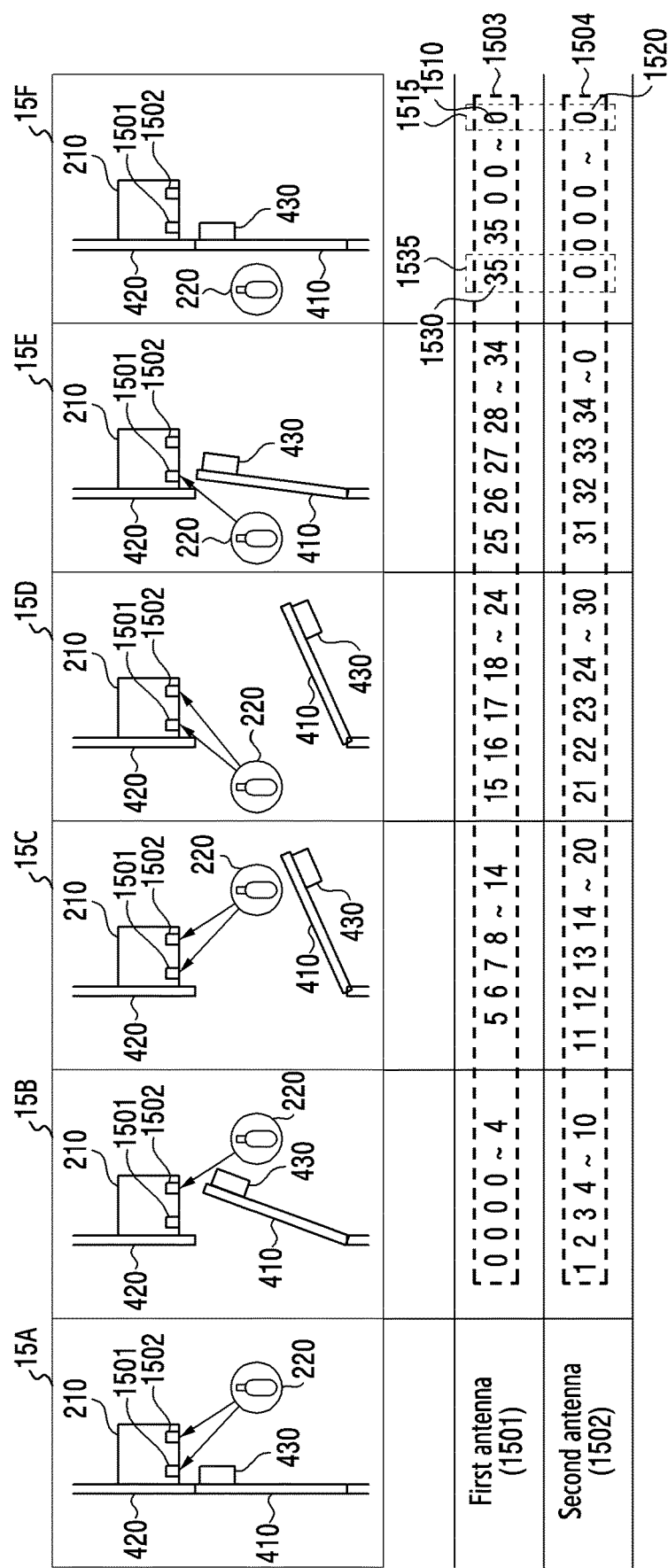
FIG. 15A is a diagram illustrating an example first sequence number and a second sequence number if a location area of an external device is changed from inside to outside of a structure according to an embodiment of the disclosure.
Figure 15B:
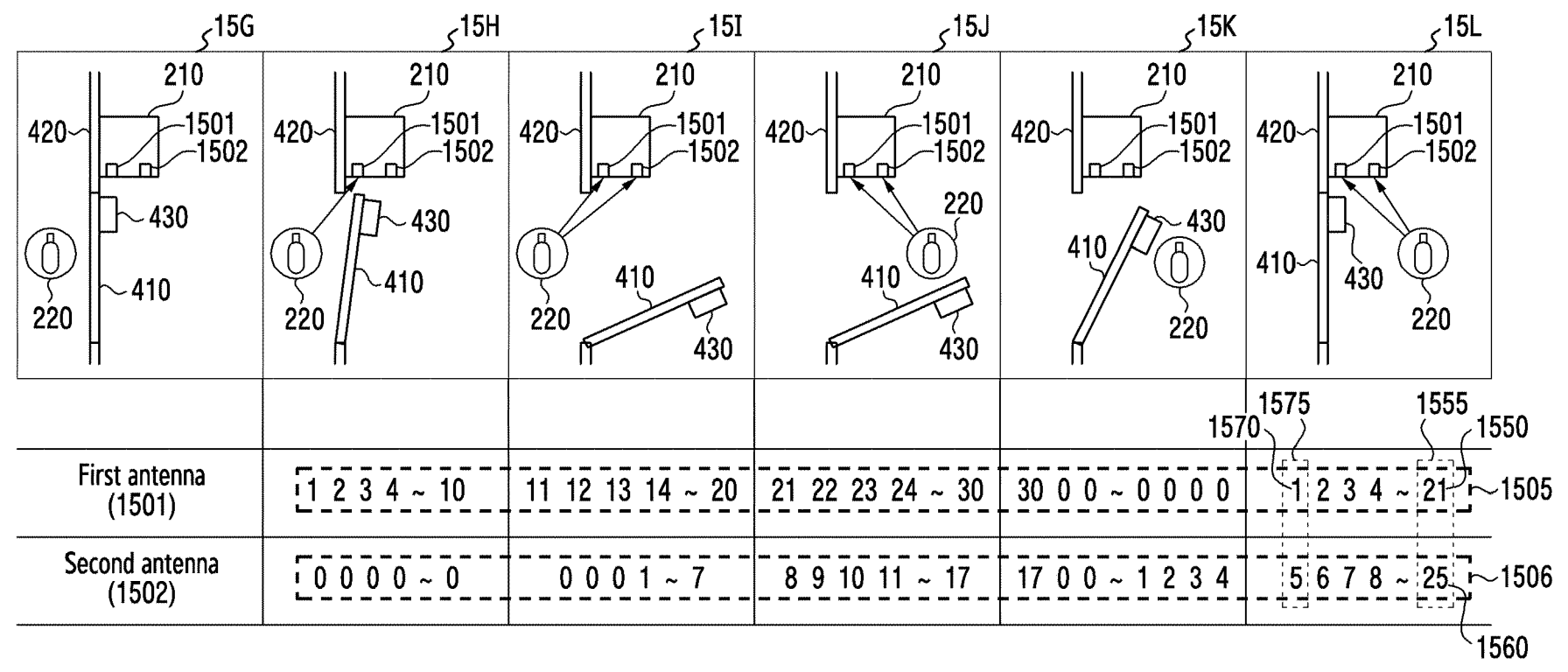

FIG. 15A and FIG. 15B are diagrams illustrating example operations of an electronic device for determining a location area change of an external device using at least two antennas according to various embodiments of the disclosure.

FIG. 15A is a diagram illustrating an example first sequence number and a second sequence number counted by the electronic device 210 if the location area of the external device is changed from the inside to the outside of the structure according to various embodiments of the disclosure.

FIG. 15B is a diagram illustrating an example of the first sequence number and the second sequence number counted by the electronic device 210 if the location area of the external device is changed from the outside to the inside of the structure according to various embodiments of the disclosure.

Referring to FIG. 15A and FIG. 15B, the electronic device 210 may include the first antenna 1501 and the second antenna 1502. A sequence number counted by the electronic device 210 may include a first sequence number 1503 counted based on information received from the external device 220 via the first antenna 1501 and a second sequence number 1504 counted based on information received from the external device 220 via the second antenna 1502.

FIG. 15A may disclose six states 15A, 15B, 15C, 15D, 15E and 15F (which may be referred to hereinafter as states 15A through 15F) indicating a location relation of the electronic device 210 and the external device 220 while the location area changes from the inside to the outside, and their corresponding first sequence number 1503 and second sequence number 1504.

In the first state 15A, the external device 220 is located inside (e.g., in the inside area 450 of FIG. 4) the structure 410, and opening of the structure is not detected, and accordingly the first sequence number 1503 and the second sequence number 1504 may not be counted.

In the second state 15B, the opening of the structure 410 is detected, the first antenna 1501 does not maintain the line of sight with the external device 220, the first sequence number 1503 is continuously counted as zero, the second antenna 1502 maintains the line of sight with the external device 220, and thus the second sequence number 1504 may be counted with a value increased by a designated value (e.g., 1).

In the third state 15C, the external device 220 maintains the line of sight with the first antenna 1501 and the second antenna 1502, and thus the first sequence number 1503 and the second sequence number 1504 may be counted with a value increased by a designated value.

In the fourth state 15D, the external device 220 moves to outside through the space between the frame 420 and the structure 4410, the line of sight may be still maintained between the first antenna 1501 and the second antenna 1502 and the external device 220, and thus the first sequence number 1503 and the second sequence number 1504 may be counted with a value increased by a designated value.

In the fifth state 15E, as the structure 410 is closing with the external device 220 outside, the line of sight of the second antenna 1502 which is relatively distant from the frame 420 and the external device 220 may be blocked by the frame 420 or the structure 410. Hence, the second sequence number 1504 may be reset to zero.

In the sixth state 15F, the electronic device 210 may count the first sequence number 1503 and the second sequence number 1504 further to a second timing 1515 after a designated time (e.g., 2 seconds) from a first timing 1535 at which the structure 410 is closed. For example, based on determining that the value acquired by subtracting a sequence number 1510 corresponding to a second timing 1515 of a first sequence number 1503 from a sequence number 1520 corresponding to the second timing 1515 of a second sequence number 1504 falls within the third range, the electronic device 210 may determine the location area change of the external device 220 from the inside to the outside.

FIG. 15B may disclose six states 15G, 15H, 15I, 15J, 15K and 15L (which may be referred to hereinafter as states 15G through 15L) indicating the location relation of the electronic device 210 and the external device 220 while the location area changes from the outside to the inside, and their corresponding first sequence number 1505 and second sequence number 1506.

In the first state 15F, the external device 220 is located outside, the opening of the structure is not detected, and accordingly the first sequence number 1505 and the second sequence number 1506 may not be counted.

In the second state 15H, the structure 410 starts to open, the line of sight of the second antenna 1502 and the external device 220 may be blocked by the structure 410, and the line of sight of the first antenna 1501 and the external device 220 may be maintained. Hence, the first sequence number 1505 may be counted with a value increased by a designated value from a specific timing of the second state 15H, and the second sequence number 1506 may be maintained as zero.

In the third state 15I, as an opening angle of the structure 410 increases, the line of sight of the first antenna 1501 and the second antenna 1502 and the external device 220 may be maintained. Thus, the second sequence number 1506 may be counted with a value increased by a designated value from a specific timing in the third state 15I. The first sequence number 1505 may be also counted with a value increased by a designated value.

In the fourth state 15J, the external device 220 moves to the inside but the line of slights are still maintained, and the first sequence number 1505 and the second sequence number 1506 may be counted with a value increased by a designated value.

In the fifth state 15K, as the structure 410 is closing with the external device 220 inside, the line of sights may be blocked by the structure 410 and restored. Hence, the first sequence number 1505 and the second sequence number 1506 both may be reset to zero and then counted with a value increased by a designated value. Since the second antenna 1502 is farther than the frame 420 than the first antenna 1501, the timing at which the second sequence number 1506 increases again may precede the timing at which the first sequence number 1505 increases again.

In the sixth state 15L, if the structure 410 is closed with the external device 220 inside, the electronic device 210 may count the first sequence number 1505 and the second sequence number 1506 further to a second timing 1555 after a designated time (e.g., 2 seconds) from a first timing 1575 at which the structure 410 is closed. For example, based on determining that a value acquired by subtracting a sequence number 1560 corresponding to a second timing 1555 of a first sequence number 1505 from a sequence number 1560 corresponding to the second timing 1555 of a second sequence number 1506 does not fall within the third range but falls within the fourth range, the electronic device 210 may determine the location area change of the external device 220 from the outside to the inside.

Figure 16A:
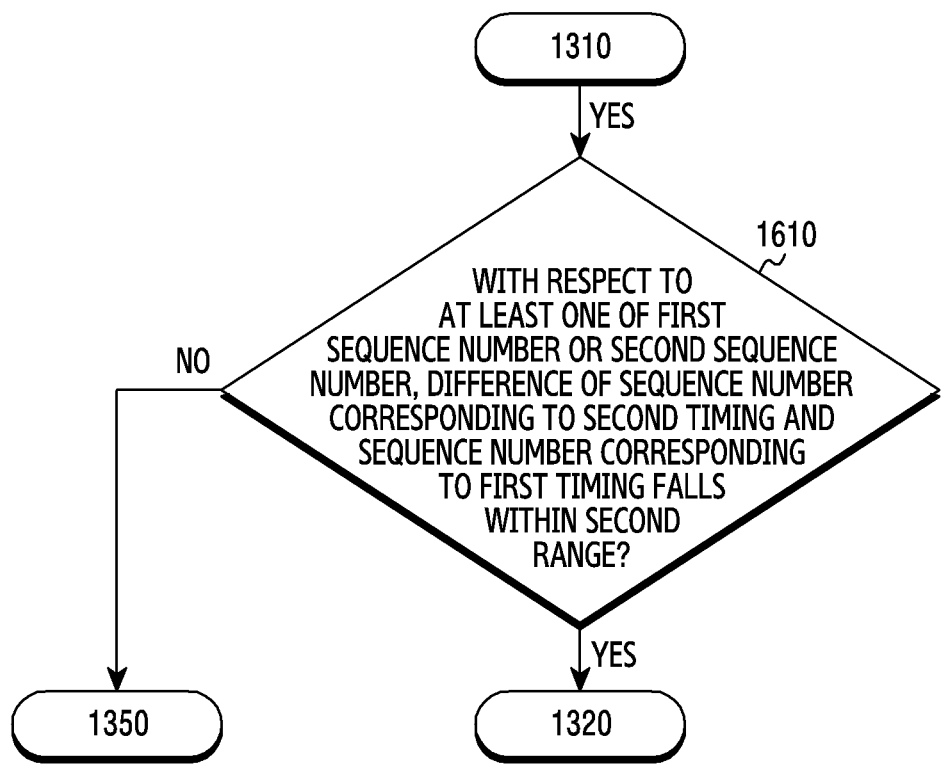
FIG. 16A is a flowchart illustrating example operations of an electronic device for determining a location area change of an external device from inside to outside according to an embodiment of the disclosure.
Figure 16B:
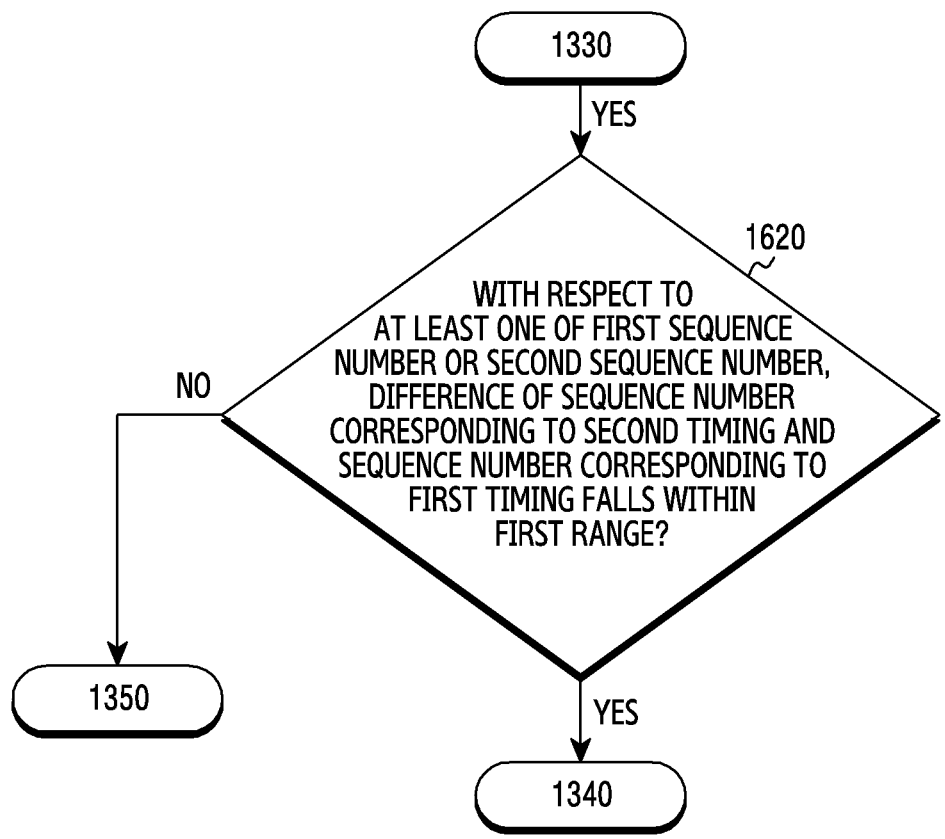
FIG. 16B is a flowchart illustrating example operations of the electronic device for determining the location area change of the external device from the outside to the inside according to an embodiment of the disclosure.

FIG. 16A and FIG. 16B are flowchart illustrating example operations of an electronic device for determining a location area change of an external device using at least two antennas according to various embodiments of the disclosure.

At least part of operations of FIG. 16A and FIG. 16B may be fulfilled by an electronic device (e.g., the electronic device 210) or a processor (e.g., the processor 310, the processor of the communication interface 330).

FIG. 16A is a flowchart illustrating example operations of an electronic device for determining a location area change of an external device from the inside to the outside, and FIG. 16B is a flowchart illustrating example operations of the electronic device for determining the location area change of the external device from the outside to the inside.

Referring to FIG. 16A, if a difference of a sequence number corresponding to a second timing of a first sequence number and a sequence number corresponding to the second timing of a second sequence number falls within a third range (operation 1310 of FIG. 13), the processor 310 may further perform operation 1610, before determining that the location area of the external device 220 is changed from the inside to the outside (operation 1320 of FIG. 13). In operation 1610, with respect to at least one of the first sequence number or the second sequence number, the processor 310 may identify whether the difference of sequence number corresponding to the second timing and the sequence number corresponding to the first timing falls within a second range.

For example, referring to FIG. 15A, the processor 310 may identify whether the difference of the sequence number 1510 corresponding to the second timing 1515 and the sequence number 1530 corresponding to the first timing 1535 in the first sequence number 1503 falls within the second range (e.g., below 0). If the difference falls within the second range, the processor 310 may determine that the location area of the external device is changed from the inside to the outside in operation 1320. If the difference does not fall within the second range, the processor 310 may display the error message in operation 1350.

Through operation 1610, the processor 310 may verify the determination that the location area of the external device 220 has been changed from the inside to the outside. The processor 310 may give more reliability in determining that the location area of the external device 220 is changed from the inside to the outside, by further conducting operation 1610 for identifying whether the location area of the external device is outside.

Referring to FIG. 16B, if the difference of the sequence number corresponding to the second timing of the first sequence number and the sequence number corresponding to the second timing of the second sequence number falls within a fourth range (operation 1330 of FIG. 13), the processor 310 may further perform operation 1620, before determining that the location area of the external device 220 is changed from the outside to the inside (operation 1340 of FIG. 13). In operation 1620, with respect to at least one of the first sequence number or the second sequence number, the processor 310 may identify whether the difference of the sequence number corresponding to the second timing and the sequence number corresponding to the first timing falls within a first range.

For example, referring to FIG. 15B, the processor 310 may identify whether the difference of the sequence number 1550 corresponding to the second timing 1555 and the sequence number 1570 corresponding to the first timing 1575 in the first sequence number 1505 falls within the first range (e.g., 18 through 22). If the difference falls within the first range, the processor 310 may determine that the location area of the external device is changed from the outside to the inside in operation 1340. If the difference does not fall within the first range, the processor 310 may display the error message in operation 1350.

Through operation 1620, the processor 310 may verify the determination that the location area of the external device 220 has been changed from the outside to the inside. By further conducting operation 1620 for identifying whether the location area of the external device is inside, the processor 310 may give more reliability in determining that the location area of the external device 220 is changed from the outside to the inside.

Figure 17A:
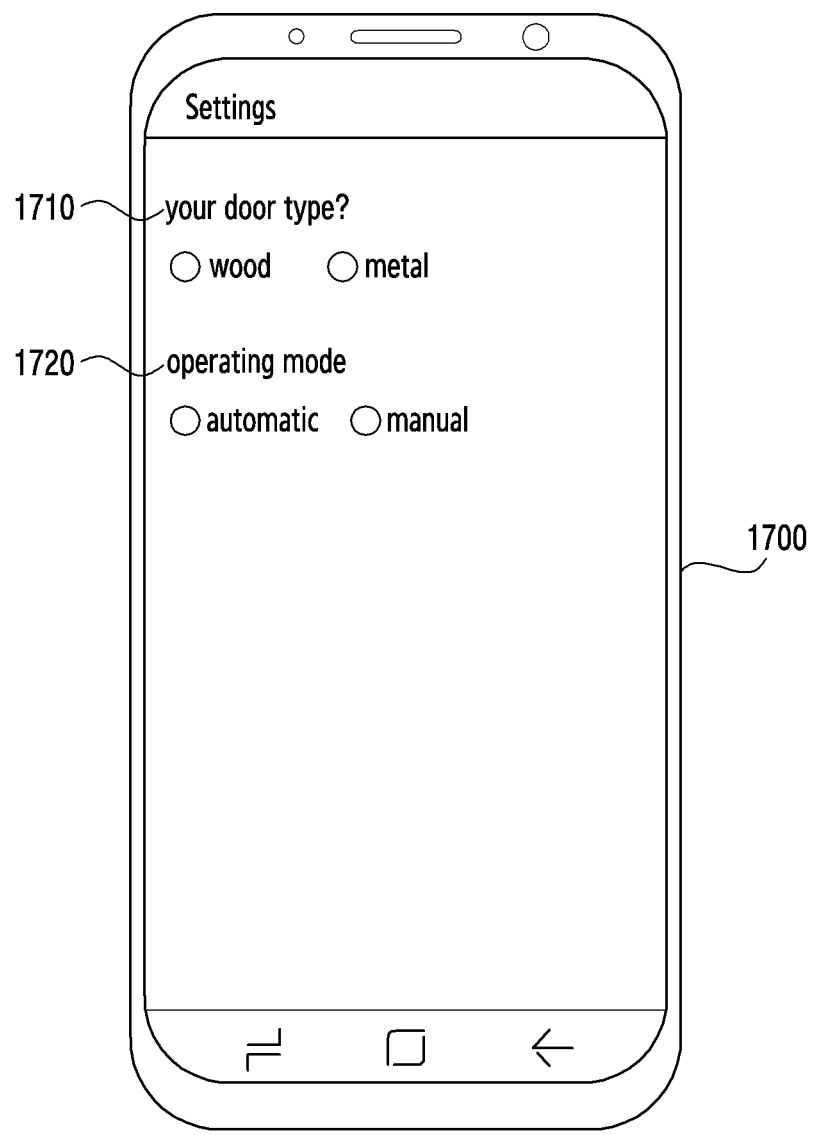
FIG. 17A is a diagram illustrating an example user interface related to an electronic device according to an embodiment of the disclosure.

FIG. 17A is a diagram illustrating an example user interface related to an electronic device according to various embodiments of the disclosure.

FIG. 17A depicts the user interface displayed at an external device 1700 related to the electronic device 210. The external device 1700 related to the electronic device 210 may be a mobile terminal such as a smartphone or a tablet PC. The user interface of FIG. 17A may be displayed at the electronic device 210.

In an embodiment, the user interface of FIG. 17A may configure setting related to the electronic device 210. The user interface for configuring the setting related to the electronic device 210 may include a user interface 1710 for selecting a material type of a structure (e.g., a door) and a user interface 1720 for selecting an operating mode.

In an embodiment, the user interface 1720 for selecting the operating mode may select a detection mode, based on the material (e.g., a metal) of the structure (e.g., the structure 410). For example, if automatic is selected, the electronic device 210 may automatically sensor or detect the material of the structure 410, without a user input which selects the material of the structure 410 (or regardless of the user input which selects the material of the structure 410). In an embodiment, the electronic device 210 may include a proximity sensor for sensing the material of the structure 410. For example, the proximity sensor may include at least one of a magnetic proximity sensor, an optical proximity sensor, an ultrasonic proximity sensor, an inductive proximity sensor, a capacitive proximity sensor, or an eddy current proximity sensor.

In an embodiment, if automatically sensing the material of the structure 410, the electronic device 210 may update the sensed information. For example, the electronic device 210 may transmit the sensed information a server, or to a mobile terminal using a peer to peer (P2P) scheme. The server may associate (or map) and store the information received from the electronic device 210 with identification information of the electronic device 210 or the mobile terminal.

In an embodiment, the electronic device 210 may update the sensed information using a framework such as open connectivity foundation (OFC) and a protocol such as constrained application protocol (CoAP).

In an embodiment, the user interface for configuring the setting related to the electronic device 210 may be displayed if the electronic device 210 is initially installed near the structure 410, or if a menu for changing the setting of the electronic device 210 is selected at the external device 1700 (or the electronic device 210).

Figure 17B:
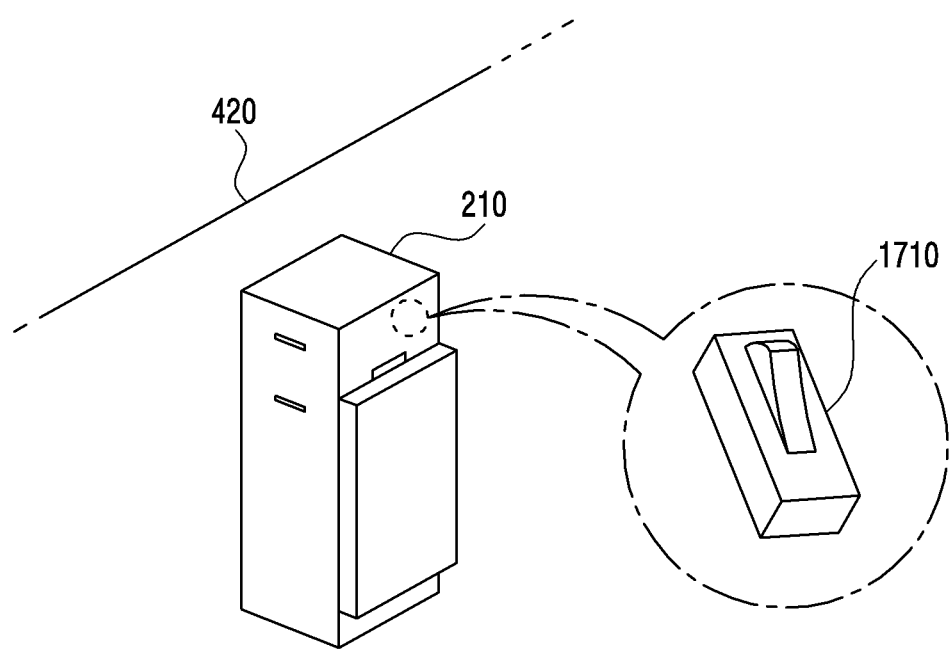
FIG. 17B is a diagram illustrating an example exterior of an electronic device disposed according to an embodiment of the disclosure.

FIG. 17B is a diagram illustrating an example exterior of the electronic device disposed according to various embodiments of the disclosure.

Referring to FIG. 17B, the electronic device 210 may include a tamper switch 1710 for sensing or detecting the material of the structure 410. In an embodiment, the tamper switch 1710 may not be exposed outside the electronic device 210. The tamper switch 1710 may include a metal contact, and the electronic device 210 may automatically sense the material of the structure 410 using the tamper switch 1710 including the metal contact.

While the electronic device 210 is disposed on the frame 420 in FIG. 17B, the electronic device 210 including the tamper switch 1710 for sensing or detecting the material of the structure 410 may be disposed on the structure 410.

An operating method of an electronic device (e.g., the electronic device 210) including at least one antenna (e.g., the antenna 340) according to various example embodiments may include: detecting that a state of a structure is changed from an open state to a close state, counting a sequence number from a first timing at which the state of the structure is changed to the close state to a second timing after a designated time based on information received from an external device via the at least one antenna using a designated communication scheme, determining location information of the external device based on the sequence number, and performing a designated function based at least in part on the determined location information.

According to various example embodiments, the location information may include location area information of the external device.

According to various example embodiments, determining the location area information of the external device may include determining the location area information of the external device based on a difference of a sequence number corresponding to the first timing and a sequence number corresponding to the second timing in the counted sequence number.

According to various example embodiments, counting the sequence number may include counting a first sequence number based on information received from the external device via a first antenna of the at least one antenna using the designated communication scheme, and counting a second sequence number based on information received from the external device via a second antenna, which is different from the first antenna, of the at least one antenna using the designated communication scheme.

According to various example embodiments, the location information may include location area change information of the external device.

According to various example embodiments, determining the location area change information of the external device may include determining the location area change information of the external device, based on a difference of a sequence number corresponding to the second timing of the first sequence number and a sequence number corresponding to the second timing of the second sequence number.

According to various example embodiments, an operating method of an electronic device (e.g., the electronic device 210) including a first antenna and a second antenna may include: based on a change of sensing data of the sensor module, detecting that a state of a structure is changed from an open state to a close state, counting a first sequence number from a first timing at which the state of the structure is changed to the close state to a second timing after a designated time based on information received from the external device via the first antenna using the designated communication scheme, counting a second sequence number from the first timing at which the state of the structure is changed to the close state to the second timing after the designated time based on information received from the external device via the second antenna using the designated communication scheme, determining a location area change of the external device based on a difference of a sequence number corresponding to the second timing of the first sequence number and a sequence number corresponding to the second timing of the second sequence number, and performing a designated function based at least in part on determining.

According to various example embodiments, the designated communicate scheme may include a UWB communication scheme.

According to various example embodiments, detecting the state change of the structure may include using sensing data of a Hall sensor for sensing a change of a magnetic field of an external sensor device. For example, the state change of the structure may be detected based on the magnetic field change of the external sensor device attached to the structure.

According to various example embodiments, among a first area and a second area divided by the structure, the electronic device may be located in the first area.

According to various example embodiments, the operating method of the electronic device may include, at the at least one processor, as at least part of determining the location area change based on the difference, if the difference falls within a third range, determining that the location area is changed from the first area to the second area, and if the difference falls within a fourth range which is different from the third range, determining that the location area is changed from the second area to the first area.

According to various example embodiments, the third range may reflect a designated error range in a second threshold, and the second threshold may be zero.

According to various example embodiments, the operating method of the electronic device may include, based on the difference not falling within the third range and the fourth range, displaying a notification that the change of the location area is not determined.

According to various example embodiments, the operating method of the electronic device may include, as at least part of determining that the location area is changed from the first area to the second area, determining that the location area is changed from the first area to the second area, further based on at least one of a difference of a sequence number corresponding to the first timing and a sequence number corresponding to the second timing in the first sequence number or a difference of a sequence number corresponding to the first timing and a sequence number corresponding to the second timing in the second sequence number.

According to various example embodiments, the operating method of the electronic device may include, as at least part of determining that the location area is changed from the second area to the first area, determining that the location area is changed from the second area to the first area, further based on at least one of a difference of a sequence number corresponding to the first timing and a sequence number corresponding to the second timing in the first sequence number or a difference of a sequence number corresponding to the first timing and a sequence number corresponding to the second timing in the second sequence number.

A computer readable recording medium may include a hard disk, a floppy disc, magnetic media (e.g., a magnetic tape), optical storage media (e.g., a CD-ROM or a DVD, magnetic-optic media (e.g., a floptical disc)), an internal memory, and so on. An instruction may include code made by a compiler or code executable by an interpreter. A module or program module according to various embodiments may include at least one or more of the aforementioned components, omit some of them, or further include other components. Operations performed by the module, the program, or another component according to various embodiments may be carried out sequentially, in parallel, repeatedly, or heuristically, or at least some operations may be executed in a different order or omitted, or other operations may be added.

The various embodiments disclosed herein and the drawings merely present various examples to aid in explanation of technical details of the disclosure and to ease the understanding, and are not intended to limit the range of the disclosure. Therefore, the scope of the disclosure should be understood as encompassing all changes or modifications derived based on the technical idea of the disclosure as well the disclosed embodiments.

An electronic device and its operating method according to various embodiments of the disclosure may determine a location of an external electronic device even if the electronic device is installed close to a metal structure.

While the disclosure has been illustrated and described with reference to various example embodiments thereof, it will be understood that the various example embodiments are intended to be illustrative, not limiting. It will be further understood by one of ordinary skill in the art that various changes in form and detail may be made without departing from the true spirit and full scope of the disclosure, including the appended claims and equivalents thereof.

What is claimed is:

1. An electronic device comprising:
   a sensor module including at least one sensor configured to detect a state change of a structure;
   a communication interface including at least one antenna and configured to communicate with an external device using a designated communication scheme;
   at least one processor operatively coupled with the sensor module and the communication interface; and
   at least one memory operatively coupled with the at least one processor,
   wherein the at least one memory stores instructions which, when executed, cause the at least one processor to:
   based on a change of sensing data of the sensor module, detect that a state of the structure is changed from an open state to a close state,
   count a sequence number from a first timing at which the state of the structure is changed to the close state to a second timing after a designated time based on information received from the external device using the designated communication scheme,
   determine a location area of the external device based on a difference of a sequence number corresponding to the first timing and a sequence number corresponding to the second timing in the counted sequence number, and
   perform a designated function based at least in part on the determining.

2. The electronic device of claim 1, wherein, the electronic device is located in a first area among the first area and a second area defined by the structure.

3. The electronic device of claim 2, wherein the instructions, when executed, cause the at least one processor to: as at least part of determining the location area of the external device based on the difference,
   based on the difference falling within a first range, determine the location area of the external device to be the first area, and
   based on the difference falling within a second range different from the first range, determine the location area of the external device to be the second area.

4. The electronic device of claim 3, wherein the first range is determined based on a first threshold, and
   the first threshold is determined based on a setting value related to the designated time and the designated communication scheme.

5. An electronic device comprising:
   a sensor module including at least one sensor configured to detect a state change of a structure;
   a communication interface including a first antenna and a second antenna and configured to communicate with an external device using a designated communication scheme;
   at least one processor operatively coupled with the sensor module and the communication interface; and
   at least one memory operatively coupled with the at least one processor,
   wherein the at least one memory stores instructions which, when executed, cause the at least one processor to:
   based on a change of sensing data of the sensor module, detect that a state of the structure is changed from an open state to a close state,
   count a first sequence number from a first timing at which the state of the structure is changed to the close state to a second timing after a designated time based on information received from the external device via the first antenna using the designated communication scheme,
   count a second sequence number from the first timing at which the state of the structure is changed to the close state to the second timing after the designated time based on information received from the external device via the second antenna using the designated communication scheme,
   determine a location area change of the external device based on a difference of a sequence number corresponding to the second timing of the first sequence number and a sequence number corresponding to the second timing of the second sequence number, and perform a designated function based at least in part on the determining.

6. The electronic device of claim 5, wherein the designated communicate scheme comprises an ultra-wideband (UWB) communication scheme.

7. The electronic device of claim 5, wherein the sensor comprises a Hall sensor configured to sense a change of a magnetic field of an external sensor device.

8. The electronic device of claim 7, wherein the external sensor device is attached to the structure.

9. The electronic device of claim 5, wherein the at least one processor is included in the communication interface.

10. The electronic device of claim 5, wherein, the electronic device is located in a first area among the first area and a second area defined by the structure.

11. The electronic device of claim 10, wherein the instructions, when executed, cause the at least one processor to: as at least part of determining the location area change based on the difference, based on the difference falling within a third range, determine that the location area is changed from the first area to the second area, and based on the difference falling within a fourth range different from the third range, determine that the location area is changed from the second area to the first area.

12. The electronic device of claim 11, wherein the third range corresponds to a designated error range in a second threshold, and the second threshold is zero.

13. The electronic device of claim 11, further comprising:
a display operatively coupled with the processor, wherein the instructions, when executed, cause the at least one processor to: based on the difference not falling within the third range and the fourth range, control the display to display a notification that the change of the location area is not determined.

14. The electronic device of claim 11, wherein the instructions, when executed, cause the at least one processor to: as at least part of determining that the location area is changed from the first area to the second area, determine that the location area is changed from the first area to the second area, further based on at least one of a difference of a sequence number corresponding to the first timing and a sequence number corresponding to the second timing in the first sequence number or a difference of a sequence number corresponding to the first timing and a sequence number corresponding to the second timing in the second sequence number, and the instructions, when executed, cause the at least one processor to: as at least part of determining that the location area is changed from the second area to the first area, determine that the location area is changed from the second area to the first area, further based on at least one of a difference of a sequence number corresponding to the first timing and a sequence number corresponding to the second timing in the first sequence number or a difference of a sequence number corresponding to the first timing and a sequence number corresponding to the second timing in the second sequence number.

15. A method of operating an electronic device comprising at least one antenna, the method comprising:

detecting that a state of a structure is changed from an open state to a close state;

counting a sequence number from a first timing at which the state of the structure is changed to the close state to a second timing after a designated time based on information received from an external device via the at least one antenna using a designated communication scheme;

determining location information of the external device based on the sequence number; and performing a designated function based at least in part on the determined location information.

16. The method of claim 15, wherein the location information comprises location area information of the external device.

17. The method of claim 16, wherein determining the location area information of the external device comprises:

determining the location area information of the external device based on a difference of a sequence number corresponding to the first timing and a sequence number corresponding to the second timing in the counted sequence number.

18. The method of claim 15, wherein counting the sequence number comprises:

counting a first sequence number based on information received from the external device via a first antenna of the at least one antenna using the designated communication scheme; and counting a second sequence number based on information received from the external device via a second antenna different from the first antenna of the at least one antenna using the designated communication scheme.

19. The method of claim 18, wherein the location information comprises location area change information of the external device.

20. The method of claim 19, wherein determining the location area change information of the external device comprises:

determining the location area change information of the external device based on a difference of a sequence number corresponding to the second timing of the first sequence number and a sequence number corresponding to the second timing of the second sequence number.

* * * * *